US 6,639,652 B1

(12) United States Patent
Mori et al.

(10) Patent No.: US 6,639,652 B1
(45) Date of Patent: Oct. 28, 2003

(54) ILLUMINATION SYSTEM FOR USE IN EXPOSURE APPARATUS

(75) Inventors: Kenichiro Mori, Utsunomiya (JP); Kazuhiro Takahashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 09/587,907

(22) Filed: Jun. 6, 2000

(30) Foreign Application Priority Data

Jun. 8, 1999 (JP) .......................................... 11-161109

(51) Int. Cl.⁷ .......................... G03B 27/54; G03B 27/42
(52) U.S. Cl. .......................................... 355/67; 355/53
(58) Field of Search ...................... 355/53, 67; 353/98;
359/850, 853, 858; 362/296, 297, 298,
299, 301, 302, 303, 304, 305, 310, 341,
346–350

(56) References Cited

U.S. PATENT DOCUMENTS

| 4,891,739 A | * | 1/1990 | Yasuda | 362/296 |
| 5,217,299 A | * | 6/1993 | Yoshida et al. | 362/298 |
| 5,526,093 A | | 6/1996 | Takahashi | 355/53 |
| 5,613,767 A | * | 3/1997 | Hamanaka et al. | 362/298 |
| 5,719,617 A | | 2/1998 | Takahashi et al. | 347/241 |
| 5,790,239 A | * | 8/1998 | Komatsuda et al. | 355/67 |
| 5,831,715 A | | 11/1998 | Takahashi | 355/53 |
| 5,847,746 A | | 12/1998 | Takahashi | 347/241 |
| 5,892,573 A | | 4/1999 | Takahashi et al. | 355/69 |
| 6,040,894 A | | 3/2000 | Takahashi | 355/53 |
| 6,055,039 A | | 4/2000 | Hayata | 355/67 |
| 6,089,720 A | * | 7/2000 | Sawai | 353/98 |
| 6,200,005 B1 | * | 3/2001 | Roberts et al. | 362/263 |
| 6,227,682 B1 | * | 5/2001 | Li | 362/302 |
| 6,285,440 B1 | * | 9/2001 | Takahashi | 355/67 |
| 6,307,601 B1 | * | 10/2001 | Kakuda et al. | 349/5 |
| 6,312,144 B1 | * | 11/2001 | Li | 362/297 |
| 6,332,688 B1 | * | 12/2001 | Magarill | 359/858 |

FOREIGN PATENT DOCUMENTS

JP                6-333795          12/1994

* cited by examiner

*Primary Examiner*—Rodney Fuller
(74) *Attorney, Agent, or Firm*—Fitzpatrick, Cella, Harper & Scinto

(57) ABSTRACT

An illumination system includes an optical system, an optical integrator and a condenser. The optical system collects light from a light source and includes a mirror for reflecting the light. The mirror has an ellipsoidal reflection surface of a shape being out of axial symmetry for defining an aperture of rectangular or semicircular shape as seen in an optical axis direction. The optical integrator produces plural light beams by use of light from the optical system and includes an array of condensing elements having a light entrance surface of rectangular shape as seen in the optical axis direction. A lengthwise direction of the rectangular-shaped or semicircular-shaped aperture of the ellipsoidal reflection surface corresponds to a lengthwise direction of the rectangular-shape light entrance surface of the condensing elements. The condenser illuminates a surface to be illuminated by use of the plural light beams.

45 Claims, 18 Drawing Sheets

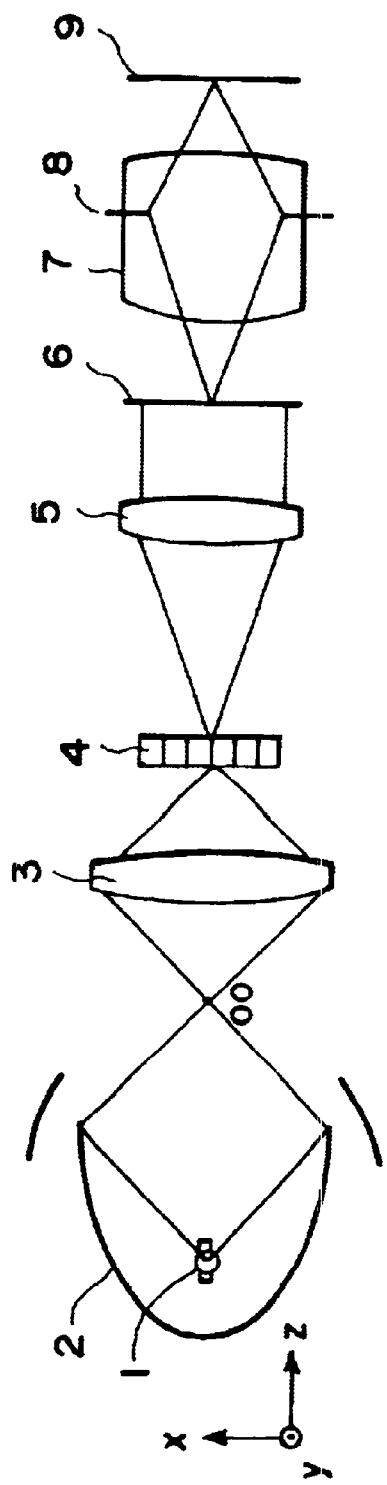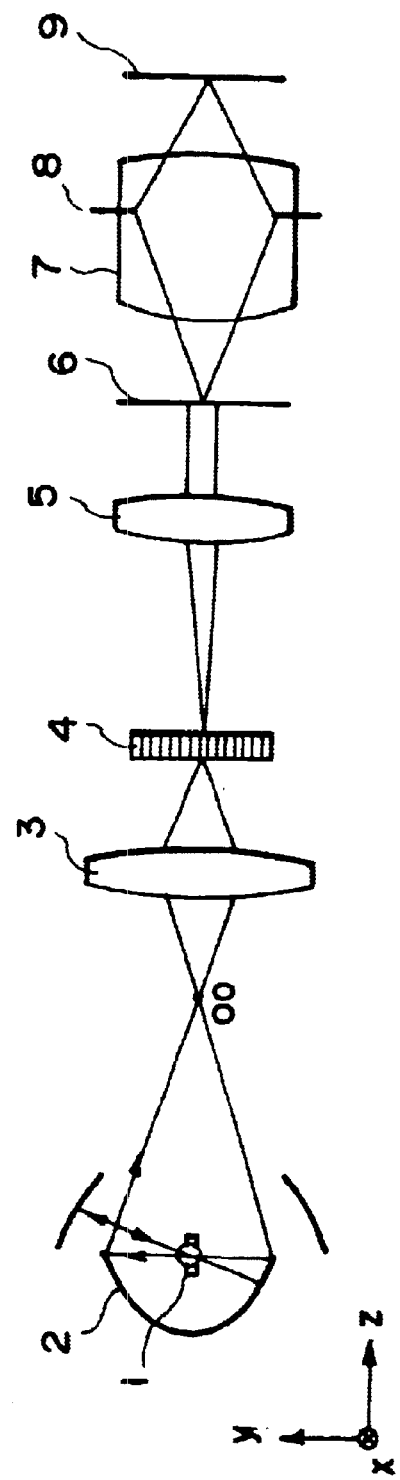
FIG. 1A
FIG. 1B

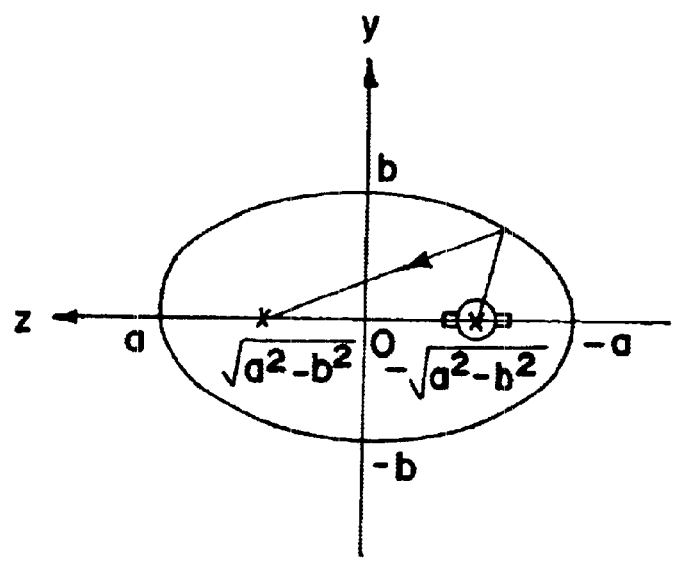
F I G. 7
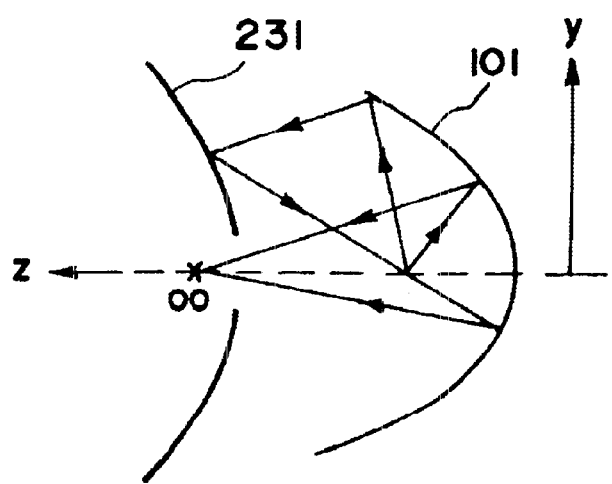
F I G. 8

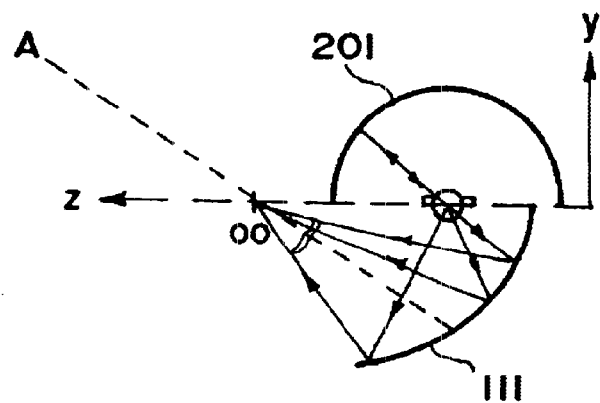
F I G. 15
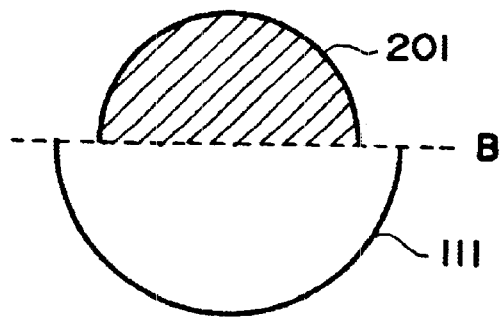
F I G. 16
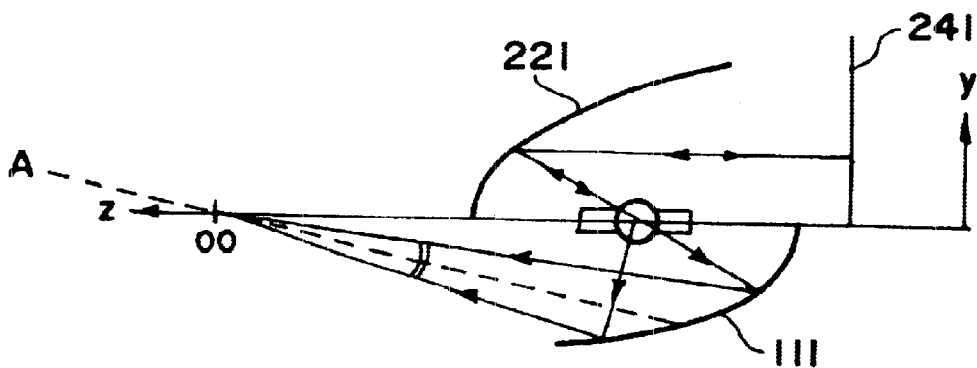
F I G. 17

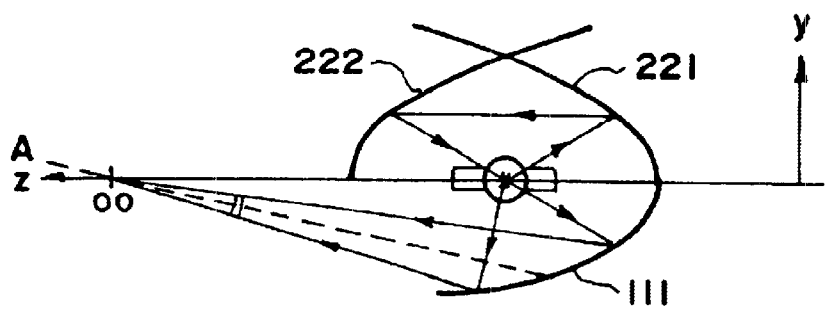
F I G. 18
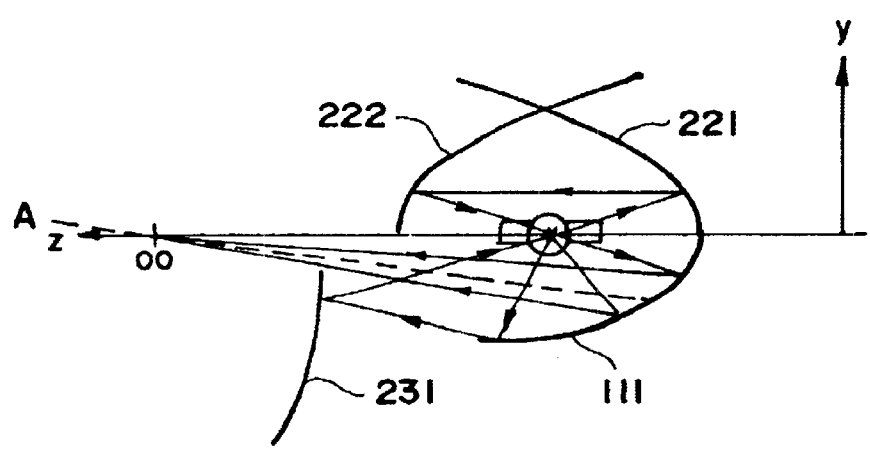
F I G. 19
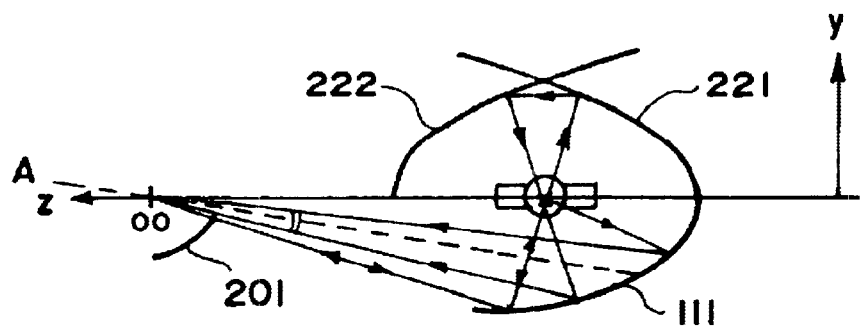
F I G. 20

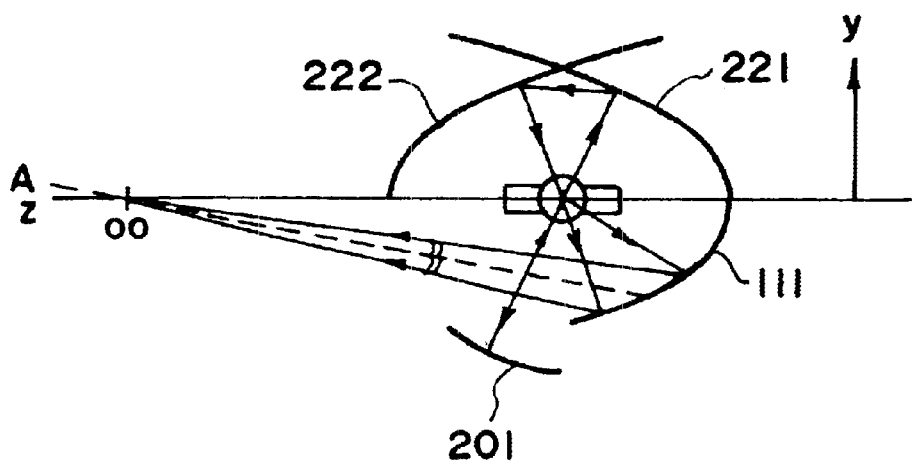
F I G. 21
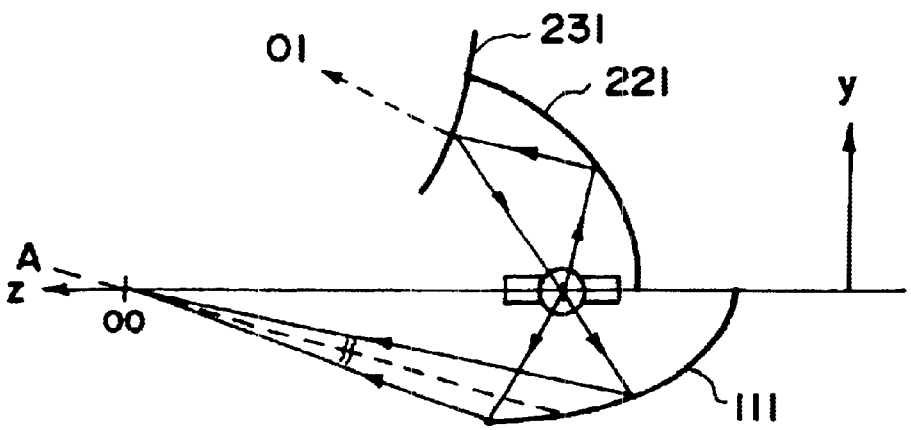
F I G. 22

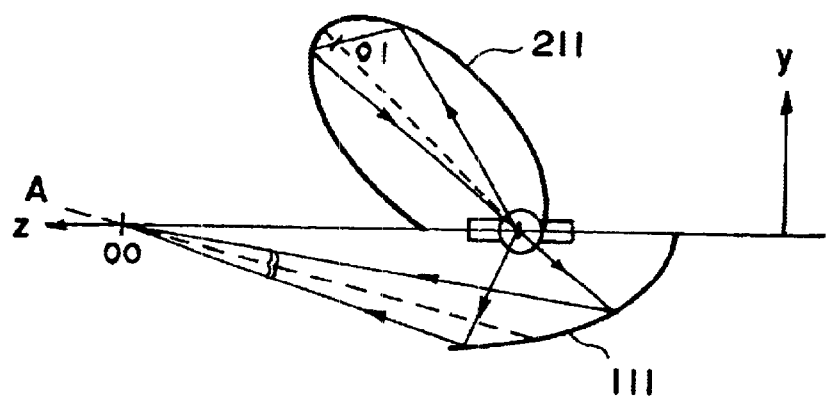
F I G. 24
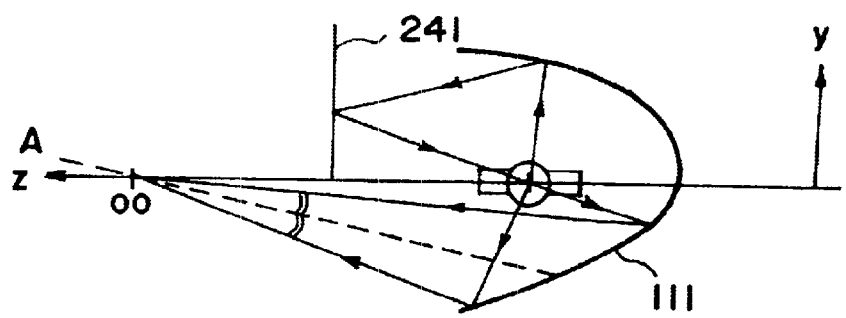
F I G. 25
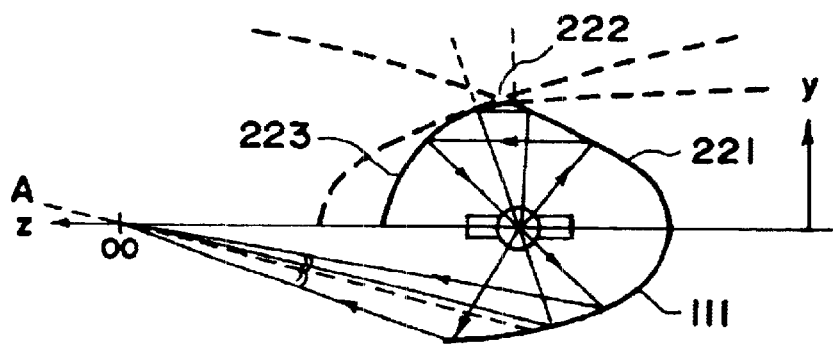
F I G. 26

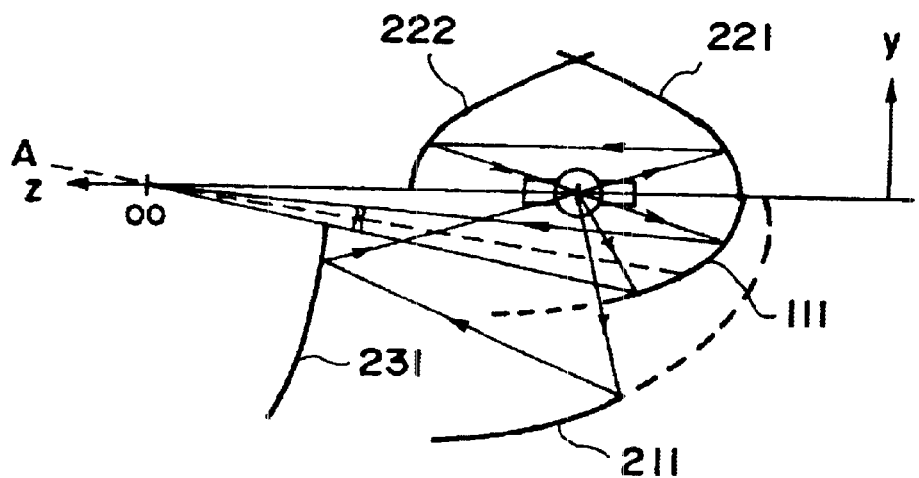
F I G. 27
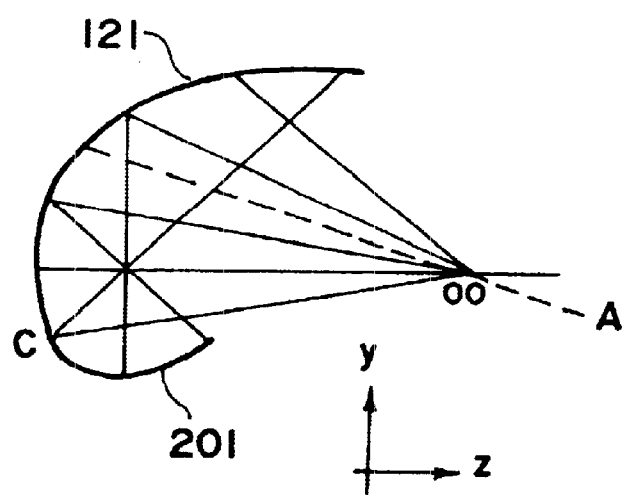
F I G. 28

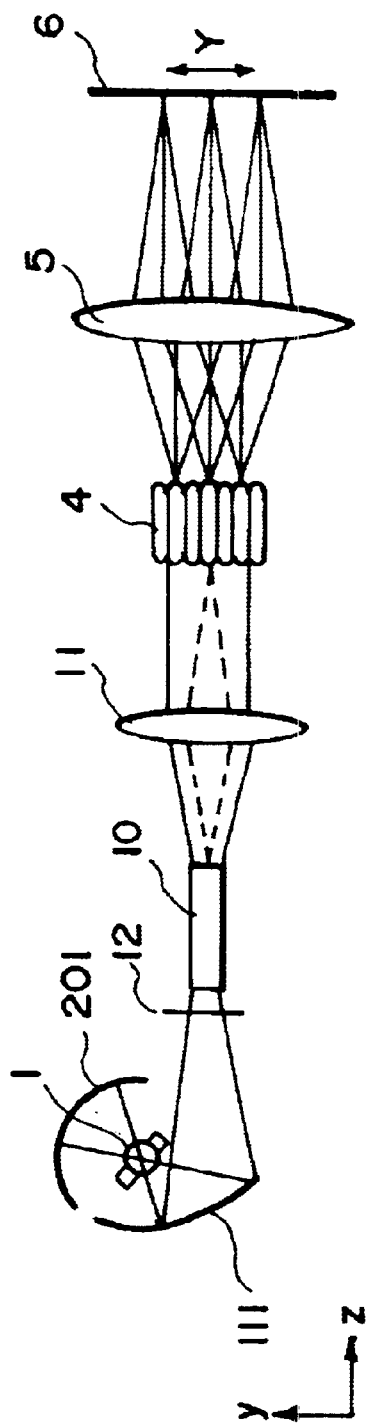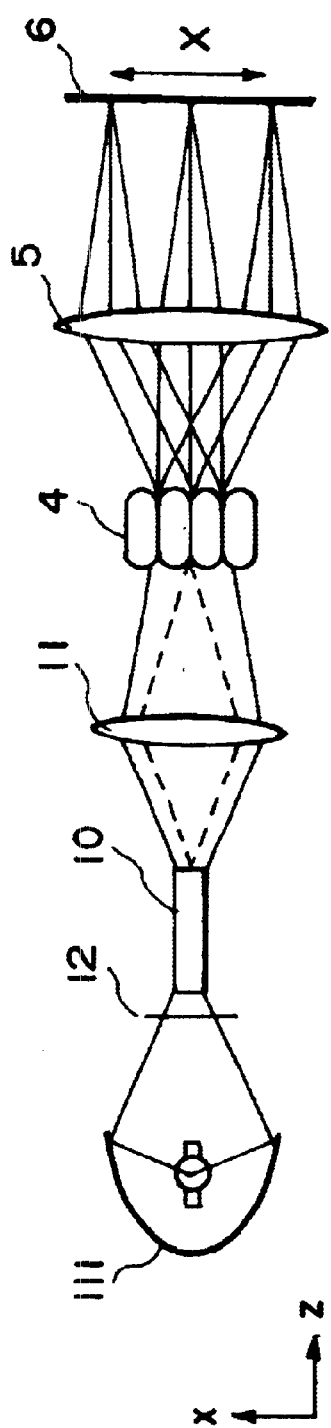
FIG. 33A
FIG. 33B

ILLUMINATION SYSTEM FOR USE IN EXPOSURE APPARATUS

FIELD OF THE INVENTION AND RELATED ART

This invention relates to an illumination system with a light source such as a high pressure Hg lamp, for example, wherein light is emitted in a range having a certain size or area. More particularly, the invention concerns an illumination system suitably usable in a projection exposure apparatus for the manufacture of semiconductor devices or liquid crystal panels, for example, in which illumination of a rectangular region is required for a reticle to be used in an exposure sequence.

Projection exposure apparatuses use an illumination system for uniformly illuminating a surface to be illuminated, by use of a light source such as a high pressure Hg lamp wherein light is emitted from a predetermined range (a range having a certain size or area) with a predetermined distribution, as disclosed in Japanese Laid-Open Patent Application, Laid-Open No. 333795/1994. Referring to FIG. 29, an example using such an illumination system will be described. Denoted in the drawing at 1 is a light source, and denoted at 2 is light collecting means for collecting light emitted from the light source 1 with a predetermined angular distribution. In this example, the collecting mirror uses an elliptical mirror. The light source 1 is disposed adjacent to a first focal point of the elliptical mirror, and the light emitted from the light source 1 is collected adjacent to a second focal point 00.

In the example of FIG. 29, an optical integrator is used to provide Koehler illumination, by which uniform illumination is accomplished. Namely, the light collected in the vicinity of the second focal point 00 of the elliptical mirror (collecting means 2) is transformed by a collimator lens 3 into parallel light which then enters an optical integrator 4 in a parallel beam. The optical integrator 4 serves to produce a number of light convergence points about a light exit end thereof. In the example of FIG. 29, these light convergence points function as secondary light sources which with and, through an optical system 5, an illumination region 6 is uniformly illuminated.

In order that the illumination is made in accordance with the shape of the illumination region, because of Koehler illumination, a fly's eye lens (as the optical integrator 4) may be designed so that the emission angle from the integrator corresponds to the illumination position. For example, if the illumination region has a square shape, a fly's eye lens comprising an array of element lenses having a square sectional shape, as shown in FIG. 30, may be used. If the illumination region has a rectangular shape, a rectangular fly's eye lens such as shown in FIG. 31A, comprising element lenses of rectangular shape having the same sectional aspect ratio as that of the illumination region, may be used.

This is because, when parallel light is projected on a rectangular fly's eye lens, as schematically shown in FIGS. 31B and 31C, the incidence height of light rays upon the light entrance face is higher in the lengthwise section in FIG. 31B than in the widthwise section in FIG. 31C, such that the largest value of the angle defined between the light ray emitted from the exit face and the optical axis becomes larger in the lengthwise direction. Namely, $\phi b > \phi c$. By performing Koehler illumination while using this emitted light, a rectangular region can be illuminated efficiently.

As regards constituent elements of optical systems where the system is used in a projection exposure apparatus, denoted in FIG. 29 at 7 is a projection lens system. Denoted at 8 is a stop of the projection lens system 7, and denoted at 9 is a wafer substrate.

However, when a fly's eye lens is used as an optical integrator, as shown in FIG. 32, there is a certain limit to the incidence angle of light that can be emitted from each element lens of the fly's eye lens. More specifically, while a light ray being incident with a certain incidence angle "a" can be emitted from the light exit face of the fly's eye lens, another light ray being incident with an incidence angle "b" larger than a certain angle cannot be emitted from the fly's eye lens because it is eclipsed by the side face of the element lens.

If light rays collected by the light collecting means 2 are completely converged at a convergence point, as described above, a completely parallel light flux can be projected on the fly's eye lens by using a collimator lens and, therefore, all the light rays emitted from the light source can be projected out of the fly's eye lens. Thus, the secondary light sources can be produced very efficiently. However, in a light source such as a high pressure Hg lamp, light rays are emitted from a predetermined range having a certain size or area, and all the light rays emitted from the light source cannot be completely collected at the second focal point only by use of a single elliptical mirror. In other words, the light rays reflected by the elliptical mirror necessarily have a particular angular distribution and a particular positional distribution, on a plane orthogonal to the optical axis and adjacent to the second focal point of the elliptical mirror.

As described, when a light source such as a high pressure Hg lamp is used, the light rays emitted from the light source cannot be collected at a single point and, therefore, all the light rays cannot be transformed into a parallel light flux even by use of a collimator lens. As a result of it, upon the light entrance surface of a fly's eye lens, the light rays necessarily have a particular angular distribution. Therefore, the relationship between the incidence angle of light upon the fly's eye lens and the capability of emission thereof from the lens must be considered. If there exist some rays that cannot be emitted from the fly's eye lens, the illuminance may be lowered by the lens.

Next, an illumination system is discussed, which is arranged so that light rays (light source image) distributed at the light convergence point are imaged upon a fly's eye lens to assure uniform illumination on a surface to be illuminated. This, however, does not narrow the scope of the present invention. The way of making light rays, being distributed about the second focal point, to enter a fly's eye lens can be chosen freely. It can be done within the scope of the present invention to make light enter a fly's eye lens while using a collimator lens such as shown in FIG. 29.

As described above, when a fly's eye lens comprising plural element lenses is used in relation to an illumination region of rectangular shape, the largest value for the incidence angle of light that can be emitted from the lens differs between that in the lengthwise direction and that in the widthwise direction of the rectangular shape. More specifically, the largest incidence angle $\theta_b$ of light that can be emitted, with respect to the lengthwise direction of FIG. 31B, is larger than the largest incidence angle $\theta_c$ of the light that can be emitted, with respect to the widthwise direction of FIG. 31C. Nevertheless, as regards the light fluxes being collected by conventional light collecting means toward the convergence point, because the elliptical mirror which is used conventionally as the light collecting means has a shape being revolutionally symmetrical with respect to the optical axis, as shown in FIG. 4, the light rays emitted from the first focal point of the elliptical mirror define a cone about the optical axis, with its apex placed at the convergence point 00. Although those to be taken into account are light rays which are not collected at the second focal point, since those light rays emitted from positions away from the first focal point go beside the cone and pass near the second focal point, only the cone defined by the light rays emitted from the first focal point is discussed here as a representative example. Also, in the following description, while only the light rays emitted from the first focal point will be discussed, those light rays emitted from positions away from the first focal point are distributed near a cone defined by the light rays from the first focal point and, therefore, a similar discussion applies.

In summary, when a conventional light collecting mirror of revolutionally symmetrical shape is used, the angular distribution of light at the convergence point is even with respect to both of the lengthwise direction and the widthwise direction. Thus, when the thus collected light is used in combination with a fly's eye lens for efficient illumination of a rectangular region, all the light rays must be made incident on the fly's eye lens at a small angle, being smaller than the largest incidence angle $\theta_c$ in relation to the widthwise direction for emission from the lens, such that all the rays can be emitted from the fly's eye lens.

However, in an optical system, there is a limitation due to an Helmholtz-Lagrange relationship. That is as, also called Helmholtz-Lagrange invariable, in an optical system, the product of the angle between two intersecting light rays and the distance of the intersection from the optical axis is reserved. As described above, since the light rays emitted from positions off the first focal point are not collected at the convergence point, there is a Helmholtz-Lagrange invariable being not zero.

This means that, when the incidence angle upon the light entrance surface of the fly's eye lens (which is at the image point) is made smaller, it results in that the image height becomes larger. Namely, the area of the light entrance surface of the fly's eye lens becomes larger. The area of the light entrance surface of a fly's eye lens corresponds to the size of an effective light source in an illumination system. Thus, in an illumination system having a definite size of an effective light source, the area of the light entrance surface of the fly's eye lens is determined fixedly and, therefore, it is not possible to make the incidence angle smaller than a certain angle. As a result, some light rays are eclipsed at the side face of each element lens and they cannot be emitted from the fly's eye lens. The efficiency of the light is, therefore, not good.

SUMMARY OF THE INVENTION

It is an object of the present invention to provide an illumination system with improved light collecting means by which even a rectangular illumination region can be illuminated with a good efficiency.

In one preferred form of the present invention, an illumination system comprises light collecting means for collecting light divergently emitted from a light source having a certain size, and a fly's eye lens as an optical integrator for defining an illumination region of rectangular shape, having different lengths with respect to two orthogonal directions, the fly's eye lens including plural element lenses arrayed along the two orthogonal directions and having a rectangular sectional shape with different lengths with respect to the two orthogonal directions, wherein the light collecting means is arranged so that a largest light convergence angle defined between an optical axis and the light collected by the light collecting means differs with respect to two orthogonal directions.

In one preferred form, the light collecting means may include a main reflection mirror for reflecting and directing the light from the light source to the optical integrator, and an auxiliary reflection mirror for directing light, not directly impinging on the main reflection mirror, and directing the same to the main reflection mirror. The main reflection mirror may comprise at least one elliptical mirror having a focal point placed at about a center of the light source. The auxiliary reflection mirror may comprise at least one of a spherical mirror having its center placed at about the first or second focal point of the main reflection mirror, a hyperboloids mirror having one focal point placed at about the first focal point of the main reflection mirror, an elliptical mirror having one focal point placed at about the first focal point of the main reflection mirror, a parabolic mirror having a focal point placed at about the first focal point of the main reflection mirror, and a plane mirror. The optical components following the light collecting means may preferably be arranged so that the largest convergence angle of light collected by the light collecting means becomes symmetrical with respect to the optical axis.

In one preferred form, the light collecting means may include a main reflection mirror for reflecting and directing the light from the light source to the optical integrator, and an auxiliary reflection mirror for directing light, not directly impinging on the main reflection mirror, and directing the same to the main reflection mirror. The main reflection mirror may comprise at least one elliptical mirror having a focal point placed at about a center of the light source, and at least one hyperboloids mirror having two focal points placed substantially at the same positions as the two focal points of the elliptical mirror, respectively. The auxiliary reflection mirror may comprise at least one of a spherical mirror having its center placed at about the first or second focal point of the main reflection mirror, a hyperboloids mirror having one focal point placed at about the first focal point of the main reflection mirror, an elliptical mirror having one focal point placed at about the first focal point of the main reflection mirror, a parabolic mirror having a focal point placed at about the first focal point of the main reflection mirror, and a plane mirror. The optical components following the light collecting means may preferably be arranged so that the largest convergence angle of light collected by the light collecting means becomes symmetrical with respect to the optical axis.

In an illumination system according to any one of these preferred embodiments, the main reflection mirror and the auxiliary reflection mirror may preferably have a shape symmetrical with respect to a plane containing the optical axis, of the optical system following the light collecting means, and being parallel to the widthwise direction of the two orthogonal directions.

In one preferred form of the present invention, the main reflection mirror may comprise an elliptical mirror having one focal point placed adjacent to the light source, and having such a shape that the mirror is placed only at one side of a plane which contains a straight line connecting two focal points of the elliptical mirror and which is parallel to the lengthwise direction of the two orthogonal directions.

In one preferred form of the present invention, the auxiliary reflection mirror may comprise a spherical surface mirror having its center placed adjacent to the center of the light source. The elliptical mirror and the spherical mirror may be disposed with a boundary adjacent to a plane which contains a straight line connecting the two focal points of the elliptical mirror and which is parallel to the lengthwise direction of the two orthogonal directions. Alternatively, the auxiliary mirror comprises at least two parabolic mirrors having a focal point adjacent to the center of the light source, and the elliptical mirror and the two parabolic mirrors may be disposed with a boundary adjacent to a plane which contains a straight line connecting the two focal points of the elliptical mirror and which is parallel to the lengthwise direction of the two orthogonal directions.

In one preferred form of the present invention, the auxiliary reflection mirror may comprise a plane mirror and a parabolic surface mirror having its focal point placed adjacent to the center of the light source. The elliptical mirror and the parabolic mirror may be disposed with a boundary adjacent to a plane which contains a straight line connecting the two focal points of the elliptical mirror and which is parallel to the lengthwise direction of the two orthogonal directions. The plane mirror may be disposed perpendicularly to parallel light as reflected by the parabolic mirror.

In one preferred form of the present invention, the auxiliary reflection mirror may comprise two parabolic surface mirrors having its focal point placed adjacent to the center of the light source, as well as a hyperboloids mirror having two focal points placed substantially at the same positions as the two focal points of the elliptical mirror. The elliptical mirror and the parabolic mirror may be disposed with a boundary adjacent to a plane which contains a straight line connecting the two focal points of the elliptical mirror and which is parallel to the lengthwise direction of the two orthogonal directions. The hyperboloids mirror may be disposed so that, of the light directed by the elliptical mirror to the optical integrator, those light rays having an angle, with respect to the optical axis, not smaller than a predetermined angle, are reflected thereby.

In one preferred form of the present invention, the auxiliary reflection mirror may comprise two parabolic surface mirrors having its focal point placed adjacent to the center of the light source, as well as a spherical surface mirror having its center placed adjacent to a focal point of the elliptical mirror, defined at a side remote from the light source. The elliptical mirror and the parabolic mirror may be disposed with a boundary adjacent to a plane which contains a straight line connecting the two focal points of the elliptical mirror and which is parallel to the lengthwise direction of the two orthogonal directions. The spherical mirror may be disposed so that, of the light directed by the elliptical mirror to the optical integrator, those light rays having an angle, with respect to the optical axis, not smaller than a predetermined angle, are reflected thereby.

In one preferred form of the present invention, the auxiliary reflection mirror may comprise two parabolic surface mirrors having its focal point placed adjacent to the center of the light source, as well as a spherical surface mirror having its center placed adjacent to the center of the light source. The elliptical mirror and the parabolic mirror may be disposed with a boundary adjacent to a plane which contains a straight line connecting the two focal points of the elliptical mirror and which is parallel to the lengthwise direction of the two orthogonal directions. The elliptical mirror may be disposed so that, of the light directed by the elliptical mirror to the optical integrator, those light rays having an angle, with respect to the optical axis, not smaller than a predetermined angle, are reflected thereby. The spherical mirror may be disposed so that it reflects any stray light from the elliptical mirror and also so that it does not intercept the light directed by the elliptical mirror to the optical integrator.

In summary, it is effective that the light collecting means is provided with an opening having different lengths along the two orthogonal directions; that the light collecting means is formed with a reflection surface having a shape being different in the two orthogonal directions; that the light collecting means is provided by two elliptical mirrors having the same focal point positions and having different lengths in major and minor diameters; or that the light collecting means comprises a main reflection mirror for directing light to the optical integrator and an auxiliary reflection mirror for directing, to the main reflection mirror, those light rays from the light source which do not directly impinge on the main reflection mirror. Also, it is effective that the main reflection mirror has an opening of substantially rectangular shape.

Further, in one preferred form of the present invention, the main reflection mirror may comprise an elliptical mirror having a first focal point placed about the center of the light source, while the auxiliary reflection mirror may comprise a spherical mirror having its center placed adjacent to the center of the light source. The elliptical mirror has an opening of a substantially rectangular shape. The spherical mirror may be disposed so that it reflects any stray light from the elliptical mirror and also so that it does not intercept the light directed by the elliptical mirror to the optical integrator. Alternatively, the main reflection mirror may comprise an elliptical mirror having a first focal point placed about the center of the light source, while the auxiliary reflection mirror may an elliptical mirror having a first focal point placed about the center of the light source, while the auxiliary reflection mirror may comprise a hyperboloids surface mirror having two focal points placed substantially at the same positions as the two focal points of the elliptical mirror. The hyperboloids mirror may have an opening of substantially rectangular shape.

In one preferred form of the present invention, the main reflection mirror may comprise an elliptical mirror having a first focal point placed about the center of the light source, while the auxiliary reflection mirror may comprise a plane mirror disposed between the two focal points of the elliptical mirror and being orthogonal to a straight line connecting the two focal points. The plane mirror may have an opening of substantially rectangular shape. Alternatively, the main reflection mirror may comprise an elliptical mirror having a first focal point placed about the center of the light source, as well as a hyperboloids mirror having two focal points placed substantially at the same positions as the two focal points of the elliptical mirror, while the auxiliary reflection mirror may comprise a hyperboloids surface mirror disposed between the two focal points of the elliptical mirror and being orthogonal to a straight line connecting the two focal points of the elliptical mirror. The hyperboloids mirror as the auxiliary reflection mirror may have an opening of substantially rectangular shape. The hyperboloids mirror as a portion of the main reflection mirror may be disposed so that is reflects light as reflected by the hyperboloids mirror of the auxiliary reflection mirror to direct the same tot he optical integrator.

Further, in one preferred form of the present invention, the main reflection mirror may comprise an elliptical mirror having a first focal point placed about the center of the light source, as well as a hyperboloids mirror having two focal points placed substantially at the same positions as the two focal points of the elliptical mirror, while the auxiliary reflection mirror may comprise a plane mirror disposed between the two foal points of the elliptical mirror and being orthogonal to a straight line connecting the two focal points. The plane mirror may have an opening of substantially rectangular shape. The hyperboloids mirror as a portion of the main reflection mirror may be disposed so that it reflects light as reflected by the plane mirror to direct the same to the optical integrator.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are sectional views schematically showing a basic structure of a projection exposure apparatus according to an embodiment of the present invention.

FIG. 7 is a schematic view of coordinates for explaining a specific example of a shape according to the first embodiment.

FIG. 8 is a sectional view of a light collecting mirror according to a second embodiment of the present invention.

FIG. 15 is a sectional view of a light collecting mirror according to a sixth embodiment of the present invention.

FIG. 16 is a schematic view of the light collecting mirror of the sixth embodiment of the present invention, as viewed from the light convergence point side.

FIG. 17 is a sectional view of a light collecting mirror according to a seventh embodiment of the present invention.

FIG. 18 is a sectional view of a light collecting mirror according to an eighth embodiment of the present invention.

FIG. 19 is a sectional view of a light collecting mirror according to a ninth embodiment of the present invention.

FIG. 20 is a sectional view of a light collecting mirror according to a tenth embodiment of the present invention.

FIG. 21 is a sectional view of a light collecting mirror according to an eleventh embodiment of the present invention.

FIG. 22 is a sectional view of a light collecting mirror according to a twelfth embodiment of the present invention.

FIG. 24 is a sectional view of a light collecting mirror according to a fourteenth embodiment of the present invention.

FIG. 25 is a sectional view of a light collecting mirror according to a fifteenth embodiment of the present invention.

FIG. 26 is a sectional view of an example, according to the eighth embodiment of the present invention, wherein the mirror is divided.

FIG. 27 is a sectional view of an example, according to the tenth embodiment of the present invention, wherein the mirror is divided.

FIG. 28 is a sectional view of an example, according to the sixth embodiment of the present invention, wherein the boundary is defined by a plane not containing the optical axis.

FIGS. 33A and 33B are schematic views for illustrating, in horizontal and vertical sections, an embodiment of an illumination system wherein a square pipe is disposed as an optical integrator, between a light source and a fly's eye lens.

DESCRIPTION OF THE PREFERRED EMBODIMENTS

Figure 2:
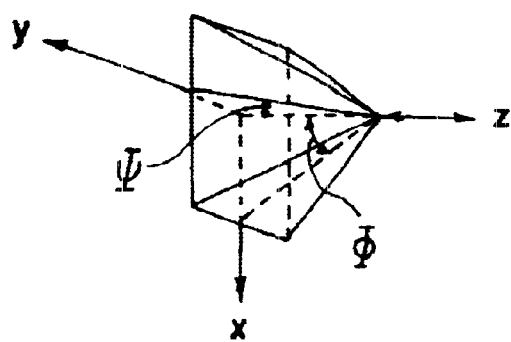
FIG. 2 is a schematic view for illustrating, in plane and section, a light flux directed to a convergence point in a case where a light collecting mirror has a rectangular opening.
Figure 3:
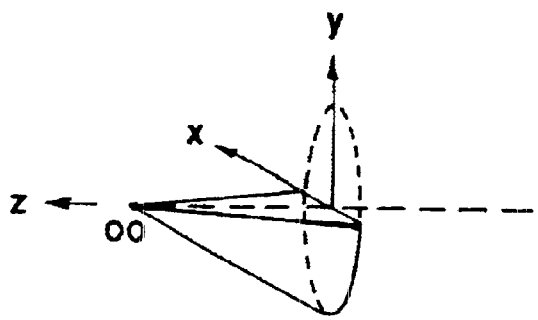
FIG. 3 is a perspective view for illustrating a light flux directed to a convergence point in a case where a light collecting mirror has a semi-circular opening.
Figure 4:
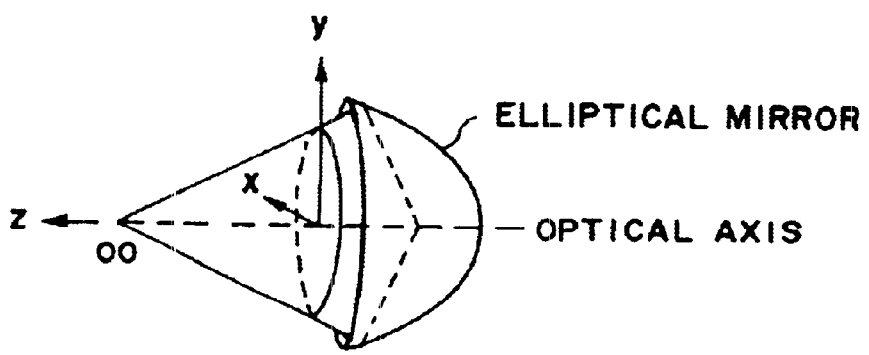
FIG. 4 is a perspective view for illustrating a light flux directed to a convergence point in a case where a conventional light collecting mirror is used.

Preferred embodiments of the present invention will now be described with reference to the accompanying drawings. Particularly, the invention will be described with reference to specific examples wherein an illumination system according to the present invention is incorporated into a projection exposure apparatus for the manufacture of semiconductor devices, for example.

FIG. 1A is a sectional view, along an X-Z plane, of a basic embodiment of a projection exposure apparatus according to the present invention. FIG. 1B is a sectional view thereof, along a Y-Z plane. Here, denoted at 1 is a high pressure Hg lamp used as a light source. It emits light from a predetermined range (a range having a predetermined size or area), with a predetermined distribution. Denoted at 2 is a mirror (light collecting means) for collecting light emitted from the light source. By making the shape of the opening of this mirror into a rectangular shape, for example, as viewed from a light convergence point 00, the light at the convergence point 00 can have different angular distributions with respect to the lengthwise direction and the widthwise direction of the rectangular opening. An optical system 3 serves to project the distribution at the convergence point 00 onto a light entrance surface of a rectangular fly's eye lens 4 which comprises a plurality of bar lenses (element lenses) having a rectangular sectional shape. Due to the function of the mirror 2 having a rectangular opening, the angular distribution of the light impinging on the rectangular fly's eye lens 4 differs between that in the lengthwise direction and that in the widthwise direction of the section of each element lens. More specifically, the largest convergence angle of the light with respect to the optical axis is smaller in the lengthwise direction of the rectangular section of the element lens, while it is larger in the lengthwise direction thereof. With this arrangement, each of the element lenses of the rectangular fly's eye lens 4 function well to produce a group of light convergence positions (i.e., secondary light sources) efficiently in the vicinity of the light exit surface thereof.

The light beams from the light convergence points produced by the rectangular fly's eye lens 4 have different emission angle distributions in two orthogonal directions (i.e., lengthwise direction and widthwise direction) of the rectangular section of each element lens. In regard to the lengthwise direction, emitted light rays are distributed with larger angles, with respect to the optical axis, than those of the widthwise direction. As a result of it, the rectangular illumination region can be illuminated with a good efficiency.

Denoted at 5 is an optical system for uniformly illuminating a reticle 6 (surface to be illuminated), in the Koehler illumination method by use of the light convergence points as produced by the fly's eye lens 4. Denoted at 7 is a projection optical system for projecting a pattern of the reticle onto a wafer substrate 9 in a reduced scale. Denoted at 8 is a stop which determines the numerical aperture of the projection optical system 7.

An important feature of the present invention resides in that the angular distribution at the light convergence point 00 of the light collecting mirror 2 (light collecting means) differs with respect to the two orthogonal directions. Various examples of the light collecting mirror 2 of FIG. 1, that is, the light collecting means, will be described below.

Embodiment 1

Figure 5A:
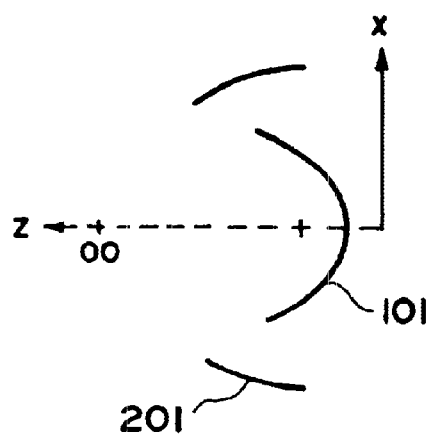
FIGS. 5A and 5B are sectional views, in vertical and horizontal sections, respectively, of a light collecting mirror according to a first embodiment of the present invention.
Figure 5B:
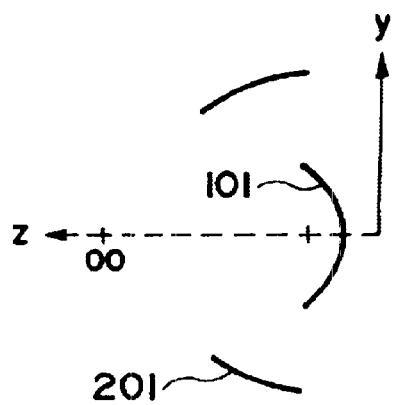

FIG. 5A is a sectional view of a light collecting mirror 2 of a first embodiment, along a section (X-Z plane) which contains an optical axis of the mirror 2 and in a direction in which light is collected at the light convergence point with smaller angles. FIG. 5B is a sectional view of the mirror 2 taken along a section (Y-Z plane) in a direction in which light is collected at the convergence point with larger angles. The light collecting mirror 2 comprises a combination of an elliptical mirror 101 having a first focal point placed at about the light source 1, and a spherical mirror 201 having its center placed adjacent the light source 1.

Figure 6:
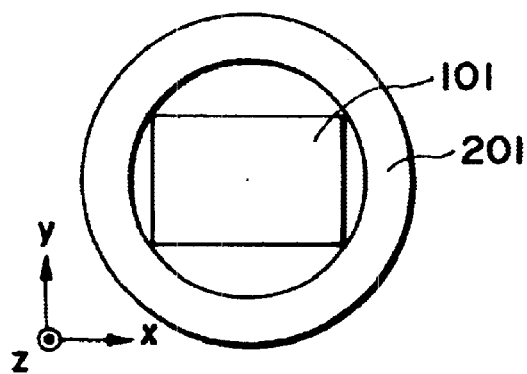
FIG. 6 is a schematic view of the light collecting mirror of the first embodiment, as viewed from the light convergence point side.

Namely, the light collecting means in this embodiment comprises a combination of an elliptical mirror 101 as a main reflection mirror, and a spherical mirror 201 as an auxiliary reflection mirror. Each of the elliptical mirror 101 and the spherical mirror 201 has a revolutionally symmetrical shape, as being rotated about the optical axis (Z axis) of FIG. 5A. However, the opening of the elliptical mirror 101 has different sizes in the two orthogonal sections as shown in FIGS. 5A and 5B. Namely, as shown in FIG. 6, the shape of the opening of the elliptical mirror 101 is rectangular (oblong) as viewed from the light convergence point 00 (second focal point of the elliptical mirror 101).

In the first embodiment, light rays emitted from the light source 1 toward the spherical mirror 201 are reflected by the spherical mirror 201 back to the portion about the center of the light source. Since, however, the central portion of the high pressure Hg lamp is hollow, these light rays can pass through the central portion of the light source. Thus, these light rays are then reflected by the elliptical mirror 101, and they are collected at the convergence point 00. On the other hand, those light rays emitted toward the elliptical mirror 101 are reflected by the elliptical mirror 101, and they are directly collected at the convergence point 00. Since the opening of the elliptical mirror in this embodiment has a rectangular shape, the light beams reaching the convergence point 00 have different convergence angles in two orthogonal directions and, thus, a quadrangular pyramid having its apex placed at the convergence point 00 is produced. As a result, light can be projected efficiently on the rectangular fly's eye lens having element lenses of rectangular sectional shape, which is very effective for illumination of a rectangular illumination region As an example of the shape of the light collecting mirror in the first embodiment, an elliptical mirror 101 having a major diameter 2a and a minor diameter 2b and a spherical mirror 201 may be used. Also, the light collecting means may have such shape that the light beams directed to the convergence point 00 are collected into a quadrangular pyramid shape (see FIG. 2) having elevation angles $\Phi$ in X direction and $\Psi$ in Y direction.

Here, while taking the center of two focal points as an origin, an orthogonal coordinate system may be set so that the two focal points of the elliptical mirror 101 arc (0, 0, ± $\sqrt{a^2-b^2}$). When the light source position is (0, 0, $-\sqrt{a^2-b^2}$) and the light convergence point is (0, 0, $\sqrt{a^2-b^2}$), then (see FIG. 7), as ψ is changed in a range $-\Psi<\psi<\Psi$ under $\phi=\pm\Phi$ and ø is changed in a range $-\Phi<\phi<\Phi$ under $\psi=\pm\Psi$, $$x=(b^2/a-c \cos \theta)\cos \theta \tan \phi \qquad (1)$$

$$y=(b^2/a-c \cos \theta)\cos \theta \tan \qquad (2)$$

$$z=-(b^2/a-c \cos \theta)\cos \theta+c \qquad (3)$$

represent the boundary of the elliptical mirror, while the spherical mirror has such radius that the light rays reflected from the boundary do not impinge thereon and it has its center at (0, 0, $\sqrt{a^2-b^2}$). Here, $\tan^2\theta=\tan^2\psi+\tan^2\phi$ and $c=\sqrt{a^2-b^2}$.

As a matter of course, if the machining is difficult from the standpoint of production, a shape for each machining may be used. For example, the elliptical mirror 101 may be cut at a position x=±X and y=±Y in the above-described coordinate system, so that the projection of the mirror takes an oblong shape. Even when a rectangular fly's eye lens is illuminated under this condition, the loss of light quantity can be reduced as compared with the conventional square opening shape.

Embodiment 2

FIG. 8 illustrates a light collecting mirror according to a second embodiment of the present invention, the mirror being illustrated in a section containing the optical axis of the mirror. The structure other than the light collecting mirror is the same as that shown in FIG. 1, and a description thereof will be omitted. The light collecting mirror of this embodiment comprises an elliptical mirror 101 as a main reflection mirror, having a first focal point placed adjacent to the light source, and a hyperboloids mirror 231 as an auxiliary mirror, having two focal points placed at substantially the same positions with respect to the elliptical mirror 101. The opening of the hyperboloids mirror 231 is rectangular, as seen from the light convergence point 00.

In the first embodiment described above, of the light emitted from the light source, those light rays not impinging on the elliptical mirror 101 which is rectangular as seen from the light convergence point 00, are reflected by the spherical mirror 201 back to the central portion of the light source. In the second embodiment, as compared therewith, of the light reflected by the elliptical mirror 101, those light rays not entering the opening which is rectangular as viewed from the convergence point 00, are reflected by the hyperboloids mirror 231 back to the portion about the center of the light source.

Namely, of the light reflected by the elliptical mirror 101 toward the convergence point 00, those light rays reaching the convergence point 00 are in a range from the convergence point 00 to the rectangular opening. Thus, the light rays reaching the convergence point 00 define a quadrangular pyramid having its apex placed at the convergence point 00. This is very effective to increase the light utilization efficiency of the fly's eye lens.

As an example of the shape of the light collecting mirror in the second embodiment, an elliptical mirror 101 as a main reflection mirror and a hyperboloids mirror 231 having two focal points at the same positions with respect to the elliptical mirror may be used. The hyperboloids mirror may have a sectional shape that can be expressed by $(x^2/a^2)-(y^2-b^2)=1$, such that the light beams directed to the convergence point 00 are collected into a quadrangular pyramid shape (see FIG. 2) having elevation angles $\Phi$ in X direction and $\psi$ in Y direction.

Figure 9:
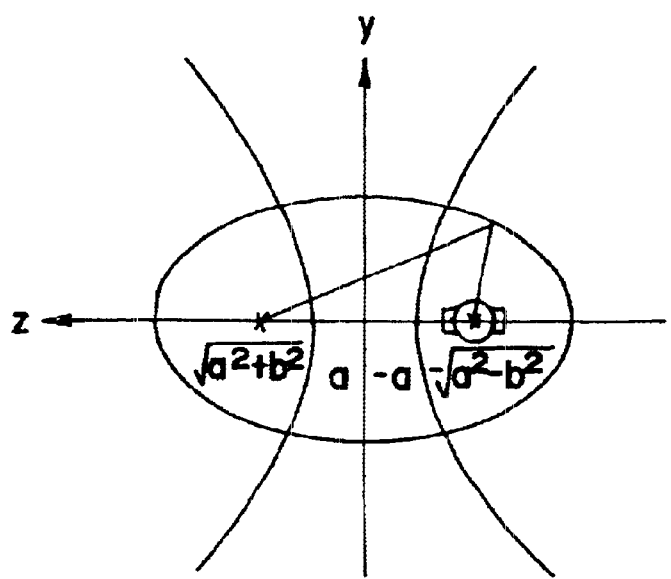
FIG. 9 is a schematic view of coordinates for explaining a specific example of a shape according to the second embodiment.

Here, while taking the center of two focal points as an origin, an orthogonal coordinate system may be set so that the two focal points are $(0, 0, +\sqrt{a^2+b^2})$. When the light source is $(0, 0, \sqrt{a^2+b^2})$ and the light convergence point is $(0, 0, -\sqrt{a^2+b^2})$, then (see FIG. 9), as $\psi$ is changed in a range $-\Psi<\psi<\Psi$ under $\phi=\pm\Phi$ and $\phi$ is changed in a range $-\Phi<\phi<\Phi$ under $\psi=\pm\Psi$, $$x=\{(b^2(\pm a+c \cos \theta)/(b^2\cos^2\theta-a^2\sin^2\theta)\} \cos \theta \tan \psi \quad (4)$$

$$y=\{(b^2(\pm a+c \cos \theta)/(b^2\cos^2\theta-a^2\sin^2\theta)\} \cos \theta \tan \psi \quad (5)$$

$$z=\{(b^2(\pm a+c \cos \theta)/(b^2\cos^2\theta-a^2\sin^2\theta)\} \cos \theta+c \quad (6)$$

In the above equations, x, y and z represent the position of the opening of the hyperboloids mirror 231. The elliptical mirror may well have an opening sufficient for collecting light from the light source. Here, the presence of the symbol ± means that the surface of the hyperboloids closer to either focal point may be used.

Here, $\tan^2\theta=\tan^2\Psi+\tan^2\phi$ and $c=\sqrt{a^2-b^2}$. As a matter of course, if the machining is difficult from the standpoint of production, a shape for easy machining may be used. For example, the hyperboloids mirror 231 may be cut at a position $x=\pm X$ and $y=\pm Y$ in the above-described coordinate system, so that the projection of the mirror takes an oblong shape. Even when a rectangular fly's eye lens is illuminated under this condition, the loss of light quantity can be reduced as compared with the conventional square opening shape.

Embodiment 3

Figure 10:
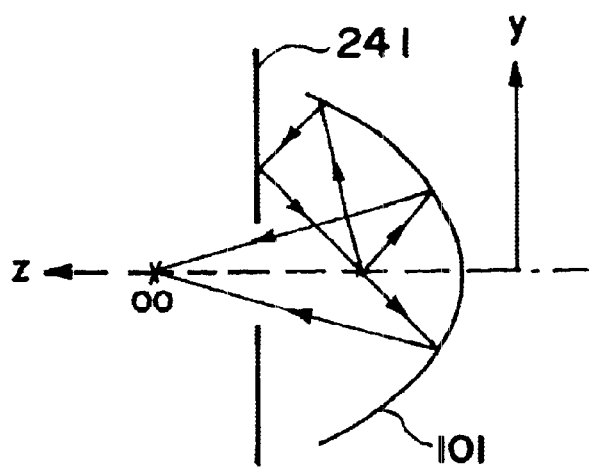
FIG. 10 is a sectional view of a light collecting mirror according to a third embodiment of the present invention.

FIG. 10 is a sectional view of a light collecting mirror according to a third embodiment of the present invention, taken along a section containing the optical axis of the mirror. The structure other than the light collecting mirror is the same as that of FIG. 1. In this embodiment, the light collecting mirror comprises an elliptical mirror 101 as a main reflection mirror having a first focal point placed about the light source, and a plane mirror 241 as an auxiliary mirror, disposed approximately at the middle of the two focal points of the elliptical mirror 101. The opening of the plane mirror 241 is rectangular as seen from the light convergence point 00 (adjacent the second focal point of the elliptical mirror 101).

In the third embodiment, like the second embodiment, of the light reflected by the elliptical mirror 101, those light rays not entering the opening of the plane mirror 241 which is rectangular as viewed from the convergence point 00, are reflected by the plane mirror 241 back to the portion about the center of the light source. Also, since, of the light reflected by the elliptical mirror 101 toward the convergence point 00, those light rays reaching the convergence point 00 are in a range from the convergence point 00 to the rectangular opening, the light rays reaching the convergence point 00 define a quadrangular pyramid having its apex placed at the convergence point 00. This is very effective to increase the light utilization efficiency of the fly's eye lens. Since the mirror used comprises a plane mirror 241 and only the provision of a rectangular opening is necessary, the machining work is very simple.

Embodiment 4

Figure 11:
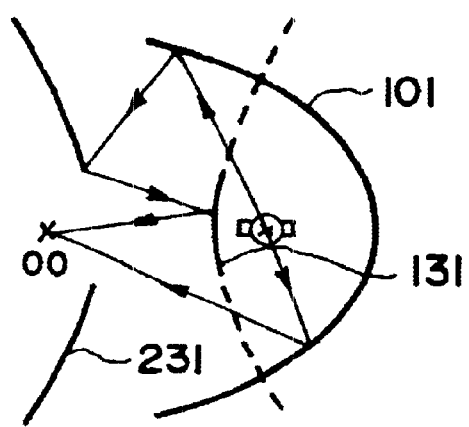
FIG. 11 is a sectional view of a light collecting mirror according to a fourth embodiment of the present invention.

FIG. 11 is a sectional view of a light collecting mirror according to a fourth embodiment of the present invention, taken along a section containing the optical axis of the mirror. The structure other than the light collecting mirror is the same as that of FIG. 1. In this embodiment, the light collecting mirror comprises an elliptical mirror 101 as a main reflection mirror having a first focal point placed about the light source, and a first hyperboloids mirror 231 as an auxiliary mirror, having two focal points placed at substantially the same positions with respect to the elliptical mirror 11 as well as a second hyperboloids mirror, having two focal points placed at substantially the same position with respect to the elliptical mirror 101 as well as a second hyperboloids mirror 131 as a portion of the main reflection mirror, having two focal points placed substantially at the same positions with respect to the elliptical mirror 101. The opening of the mirror 231 is rectangular as seen from the light convergence point 00 (adjacent the second focal point of the elliptical mirror 101).

While in the first, second and third embodiments, light rays directed off the rectangular opening are returned to the central portion of the light source, in the fourth embodiment, the light rays going back to the central portion of the light source are reflected by the second hyperboloids mirror 131 so that they are collected at the convergence point 00. In this embodiment, the void through the lamp can be made small, and it is very effective to assure more uniform illumination.

The shape of the hyperboloids mirror 231 may be the same as that of the hyperboloids mirror 231 of the second embodiment. In place of the hyperboloids mirror 231 which determines the opening, a flat mirror 241 of the third embodiment may be used.

Embodiment 5

Figure 12:
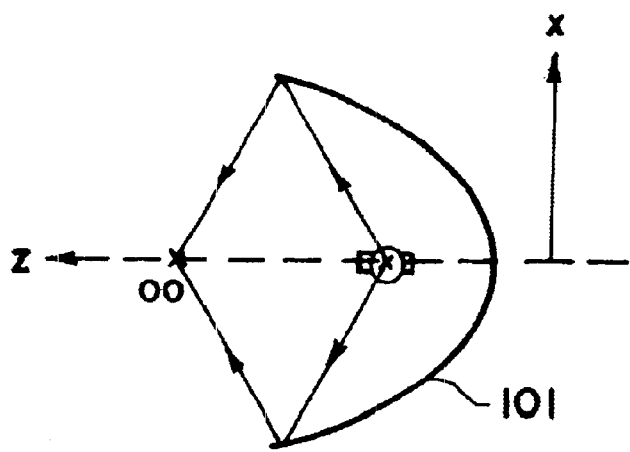
FIG. 12 is a sectional view of a light collecting mirror according to a fifth embodiment of the present invention, taken along a certain plane.
Figure 13:
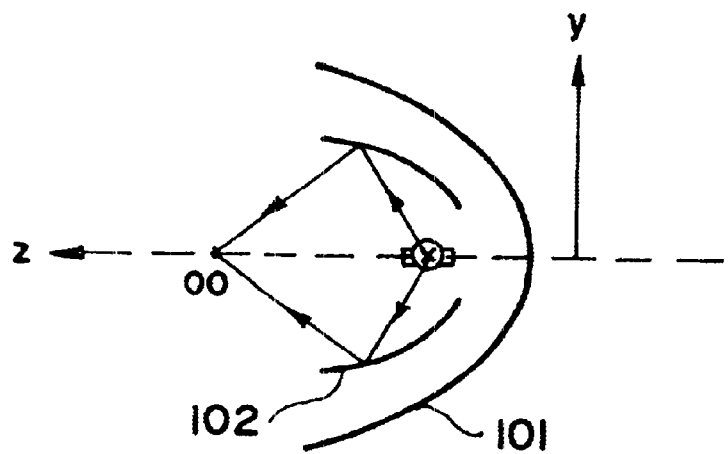
FIG. 13 is a sectional view of the light collecting mirror according to a fifth embodiment of the present invention, taken along a plane orthogonal to the plane of FIG. 12.

FIGS. 12 and 13 are sectional views of a light collecting mirror according to a fifth embodiment of the present invention, taken along two orthogonal sections containing the optical axis of the mirror. The structure other than the light collecting mirror is the same as that of FIG. 1. Conventional elliptical mirrors have a shape defined by rotating an ellipsoid having a major axis length and a minor axis length about the major axis. As compared therewith, the light collecting mirror of this embodiment uses an elliptical mirror 101 and another elliptical mirror 102 having two focal points placed at substantially the same positions as the elliptical mirror 101 and having different major axis length and minor axis length. A portion of the elliptical mirror 102 is superposedly disposed so that a difference in opening is produced in two orthogonal directions.

Figure 14:
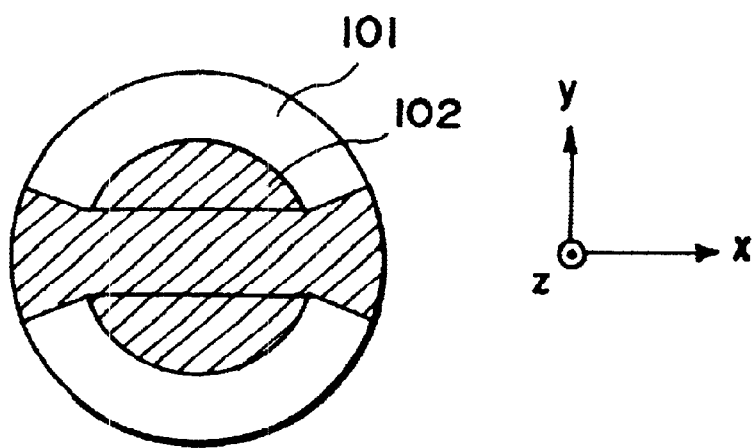
FIG. 14 is a schematic view of the light collecting mirror of the fifth embodiment of the present invention, as viewed from the light convergence point side.

FIG. 14 shows the light collecting mirror of the fifth embodiment, as seen from the light convergence point 00. Here, light rays emitted upwardly and downwardly are reflected by the elliptical mirror 102 having a smaller major axis and minor axis, and they are collected to the convergence point 00 with smaller angles. On the other hand, light rays emitted leftwardly and rightwardly are reflected by the elliptical mirror 101 having a larger major axis and minor axis, and they are collected with larger angles.

The light rays reaching the convergence point 00 define a pyramid with its bottom depicted by the hatched portion in FIG. 14 and its apex placed at the convergence point 00. Thus, as compared with a case where a conventional mirror is used, energies emitted from the light source can be used efficiently for illumination of the rectangular fly's eye lens.

In the fifth embodiment, while the elliptical mirror 101 having a larger major axis and minor axis is formed with a completely elliptical mirror structure, only those portions not covered by the elliptical mirror 102 of a smaller major axis and minor axis are sufficient. Thus, only the hatched portion in FIG. 14 is necessary as the reflection surface.

Embodiment 6

FIG. 15 is a sectional view of a light collecting mirror according to a sixth embodiment of the present invention, taken along a section containing the optical axis of the mirror and including a direction, of two orthogonal directions, in which light rays of a largest convergence angle are collected at the light convergence point with a smaller angle. The structure other than the collecting mirror is the same as that shown in FIG. 1. In this embodiment, the light collecting mirror comprises an elliptical mirror 111 as a main reflection mirror, having a first focal point placed at about the light source, and a spherical mirror 201 as an auxiliary mirror, having its center placed adjacent to the light source. The opening of the light collecting mirror is semi-circular as seen from the light convergence point 00 (adjacent to the second focal point of the elliptical mirror 111).

FIG. 16 shows the light collecting mirror of the sixth embodiment, as viewed from the light convergence point 00. The lower semicircle corresponds to an end portion of the elliptical mirror 111, and the upper semi-circle corresponds to the spherical mirror 201. The reflection surface of the spherical mirror in the semi-circle faces to the light source side, such that it can not be seen from the light convergence point 00 side. Thus, as viewed from the convergence point 00, there is no opening in the spherical mirror 201 As seen from the convergence point 00, therefore, only the semi-circular opening of the elliptical mirror 111 is the opening of the light collecting mirror. Here, the light emitted from the light source toward the spherical mirror 201 is reflected by the spherical mirror 201 back to the portion about the center of the light source Since the central portion of the high pressure Hg lamp is hollow, the light passes through the central portion of the light source and it is reflected by the elliptical mirror 101 and is collected to the convergence point 00. On the other hand, those light rays reflected toward the elliptical mirror 111 are reflected thereby and are collected toward the convergence point 00. However, since the opening of the light collecting mirror is semi-circular, the light rays reaching the convergence point 00 define a pyramid shape corresponding to a half of a cone having its apex placed at the convergence point 00. Thus, as compared with a conventional mirror, energies from the light source can be used efficiently for illumination of a of a rectangular fly's eye lens.

In the sixth embodiment, the optical axis of the optical system following the light collecting means may preferably be set so that, in the two orthogonal directions, largest values of the angles with respect to the optical axis become symmetrical with each other. Namely, a straight line A in FIG. 15 should preferably be set as the optical axis for the optical system following the light collecting means. This is because, as described hereinbefore, for efficient illumination of a rectangular fly's eye lens, the Helmholtz-Lagrange invariable should be made smaller.

Embodiment 7

FIG. 17 is a sectional view of a light collecting mirror according to a seventh embodiment of the present invention, taken along a section containing the optical axis of the mirror and including a direction, of two orthogonal directions, in which light rays of a largest convergence angle are collected at the light convergence point with a smaller angle. The structure other than the collecting mirror is the same as that shown in FIG. 1. In this embodiment, the light collecting mirror comprises an elliptical mirror 111 as a main reflection mirror, having a first focal point placed at about the center of the light source, and a parabolic mirror 221 as a portion of an auxiliary mirror, having a focal point placed adjacent to the center of the light source, as well as a plane mirror 241 as a portion of the auxiliary mirror. The opening of the light collecting mirror is semi-circular as seen from the light convergence point 00 (adjacent to the second focal point of the elliptical mirror 111).

In the sixth embodiment described above, light rays directed off the elliptical mirror which defines an opening are reflected by the spherical mirror 201 back to the portion about the center of the light source. In this embodiment, as compared therewith, the light rays are reflected by the parabolic mirror 221 and the plane mirror 241 backwardly toward the light source. Namely, those light rays directed off the elliptical mirror 111 are reflected by the parabolic mirror 221 into parallel light. This parallel light is then reflected by the plane mirror 241 disposed perpendicularly to the parallel light, such that it is reflected as parallel light again to the parabolic mirror 221. The parallel light is then reflected by the parabolic mirror 221, again toward the central portion of the light source.

Since the opening of the light collecting mirror is semi-circular, the light rays reaching the convergence point 00 define a pyramid shape corresponding to a half of a cone having its apex placed at the convergence point 00. Thus, as compared with a conventional mirror, energies from the light source can be used efficiently for illumination of a rectangular fly's eye lens.

In the seventh embodiment, the optical axis of the optical system following the light collecting means may preferably be set so that, in the two orthogonal directions, the largest values of the angles with respect to the optical axis become symmetrical with each other. Namely, a straight line A in FIG. 17 should preferably be set as the optical axis for the optical system following the light collecting means. This is because, as described hereinbefore, for efficient illumination of a rectangular fly's eye lens, the Helmholtz-Lagrange invariable should be made smaller.

Embodiment 8

FIG. 18 is a sectional view of a light collecting mirror according to an eighth embodiment of the present invention, taken along a section containing the optical axis of the mirror and including a direction, of two orthogonal directions, in which light rays of a largest convergence angle are collected at the light convergence point with a smaller angle. The structure other than the collecting mirror is the same as that shown in FIG. 1. In this embodiment, the light collecting mirror comprises an elliptical mirror 111 as a main reflection mirror, having a first focal point placed at about the center of the light source, and two parabolic mirrors 221 and 222 as an auxiliary mirror, having a focal point placed adjacent to the center of the light source. The opening of the light collecting convergence point 00 (adjacent to the second focal point of the elliptical mirror 111).

In the sixth embodiment described above, light rays directed off the elliptical mirror 111 which defines an opening are reflected by the spherical mirror 201 back to the portion about the center of the light source. In this embodiment, as compared therewith, the light rays are reflected by the two parabolic mirrors 221 and 222 backwardly toward the light source. Namely, those light rays directed off the elliptical mirror 111 are reflected by one parabolic mirror 221 or 222 into parallel light. This parallel light is then reflected by another parabolic mirror 222 or 221 backwardly toward the central Portion of the light source. Since the opening of the light collecting mirror is semicircular, the light rays reaching the convergence point 00 define a pyramid shape corresponding to a half of a cone having its apex placed at the convergence point 00. Thus, as compared with a conventional mirror, energies from the light source can be used efficiently for illumination of a rectangular fly's eye lens In the eighth embodiment, the optical axis of the optical system following the light collecting means may preferably be set so that, in the two orthogonal directions, largest values of the angles with respect to the optical axis become symmetrical with each other. Namely, a straight line A in FIG. 18 should preferably be set as the optical axis for the optical system following the light collecting means. This is because, as described hereinbefore, for efficient illumination of a rectangular fly's eye lens, the Helmholtz-Lagrange invariable should be made smaller.

In the drawing, the parallel light as produced by the parabolic mirror is parallel to the optical axis. However, this is not always necessary. It may be in any direction unless the light from the elliptical mirror 111 defining the opening is intercepted.

Embodiment 9

FIG. 19 is a sectional view of a light collecting mirror according to a ninth embodiment of the present invention, taken along a section containing the optical axis of the mirror and including a direction, of two orthogonal directions, in which light rays of a largest convergence angle are collected at the light convergence point with a smaller angle. The structure other than the collecting mirror is the same as that shown in FIG. 1. In this embodiment, the light collecting mirror comprises an elliptical mirror 111 as a main reflection mirror, having a first focal point placed at about the center of the light source, and two parabolic mirrors 221 and 222 as an auxiliary mirror, having a focal point placed adjacent to the center of the light source, as well as a portion of a hyperboloids mirror 231, as a portion of the auxiliary mirror, having two focal points placed substantially at the same positions as the elliptical mirror 111. The opening of the light collecting mirror has a shape corresponding to that of an opening defined by the parabolic mirror 222 and the hyperboloids mirror 231, as seen from the light convergence point 00.

In the eighth embodiment described above, light rays reflected by the elliptical mirror 111 are all collected to the light convergence point 00. In this embodiment, as compared therewith, a portion of the light reflected by the elliptical mirror toward the convergence point 00 is reflected by the hyperboloids mirror 231 backwardly toward the portion around the center of the light source, by which, in two orthogonal directions, a large difference (i.e., difference in numerical aperture) is produced between the convergence angles. Since the opening of the light collecting mirror is determined by the opening defined by the parabolic mirror 222 and the hyperboloids mirror 231, the light rays reaching the convergence point 00 define a pyramid shape having its apex placed at the convergence point 00 and a bottom placed at the opening defined by the parabolic mirror 222 and the hyperboloids mirror 231. Thus, as compared with a conventional mirror, energies from the light source can be used efficiently for illumination of a rectangular fly's eye lens.

In the ninth embodiment, the optical axis of the optical system following the light collecting means may preferably be set so that, in the two orthogonal directions, largest values of the angles with respect to the optical axis become symmetrical with each other. Namely, a straight line A in FIG. 19 should preferably be set as the optical axis for the optical system following the light collecting means. This is because, as described hereinbefore, for efficient illumination of a rectangular fly's eye lens, the Helmholtz-Lagrange invariable should be made smaller.

In the drawing, the parallel light as produced by the parabolic mirror is parallel to the optical axis. However, this is not always necessary. It may be in any direction unless the light from the elliptical mirror 111 defining the opening is intercepted.

Embodiment 10

FIG. 20 is a sectional view of a light collecting mirror according to a tenth embodiment of the present invention, taken along a section containing the optical axis of the mirror and including a direction, of two orthogonal directions, in which light rays of a largest convergence angle are collected at the light convergence point with a smaller angle. The structure other than the collecting mirror is the same as that shown in FIG. 1. In this embodiment, the light collecting mirror comprises an elliptical mirror 111 as a main reflection mirror, having a first focal point placed at about the center of the light source, and two parabolic mirrors 221 and 222 as an auxiliary mirror, having a focal point placed adjacent to the center of the light source, as well as a spherical mirror 201, as a portion of the auxiliary mirror, having a center placed adjacent to another focal point 00 of the elliptical mirror 111, which point is defined at a position different from the center of the light source. The opening of the light collecting mirror has a shape corresponding to that of an opening defined by the parabolic mirror 222 and the spherical mirror 201, as seen from the light convergence point 00.

In the ninth embodiment described above, a portion of the light reflected by the elliptical mirror 111 is reflected by the hyperboloids mirror 231 backwardly toward the light source. In this embodiment, as compared therewith, a portion of the light reflected by the elliptical mirror is reflected by the spherical mirror 201 and, after being reflected by the elliptical mirror, it is directed backwardly toward the light source. By doing so, in two orthogonal directions, a large difference in numerical aperture is produced between them. Since the opening of the light collecting mirror is determined by the opening defined by the parabolic mirror 222 and the spherical mirror 201, the light rays reaching the convergence point 00 define a pyramid shape having its apex placed at the convergence point 00 and a bottom placed at the opening defined by the parabolic mirror 222 and the spherical mirror 201. Thus, as compared with a conventional mirror, energies from the light source can be used efficiently for illumination of a rectangular fly's eye lens.

In the tenth embodiment, the optical axis of the optical system following the light collecting mirror means may preferably be set so that, in the two orthogonal directions, largest values of the angles with respect to the optical axis become symmetrical with each other. Namely, a straight line A in FIG. 20 should preferably be set as the optical axis for the optical system following the light collecting means. This is because, as described hereinbefore, for efficient illumination of a rectangular fly's eye lens, the Helmholtz-Lagrange invariable should be made smaller.

In the drawing, the parallel light as produced by the parabolic mirror is parallel to the optical axis. However, this is not always necessary. It may be in any direction unless the light from the elliptical mirror 111 defining the opening is intercepted.

Embodiment 11

FIG. 21 is a sectional view of a light collecting mirror according to an eleventh embodiment of the present invention, taken along a section containing the optical axis of the mirror and including a direction, of two orthogonal directions, in which light rays of a largest convergence angle are collected at the light convergence point with a smaller angle. The structure other than the collecting mirror is that same as that shown in FIG. 1. In this embodiment, the light collecting mirror comprises an elliptical mirror 111 as a main reflection mirror, having a first focal point placed at about the center of the light source, and two parabolic mirrors 221 and 222 as an auxiliary mirror, having a focal point placed adjacent to the center of the light source, as well as a spherical mirror 201, as a portion of the auxiliary mirror, having a center placed adjacent to the center of the light source. The opening of the light collecting mirror has a shape corresponding to that of an opening defined by the elliptical mirror 111 and the parabolic mirror 222, as seen from the light convergence point 00.

In the eighth embodiment described above, the light rays emitted downwardly in the drawing are all reflected by the elliptical mirror 111. In this embodiment, as compared therewith, a portion of the light reflected downwardly is reflected by the spherical mirror 201 backwardly toward the central portion of the light source. By doing so, in two orthogonal directions, a large difference in numerical aperture is produced between them. Since the opening of the light collecting mirror has such a shape as viewing the elliptical mirror 111 and the parabolic mirror 222 from the light convergence point 000, the light rays reaching the convergence point 00 define a pyramid shape having its apex placed at the convergence point 00 and a bottom placed at the opening of the elliptical mirror 111. Thus, as compared with a conventional mirror, energies from the light source can be used efficiently for illumination of a rectangular fly's eye lens.

In the eleventh embodiment, the optical axis of the optical system following the light collecting means may preferably be set so that, in the two orthogonal directions, largest values of the angles with respect to the optical axis become symmetrical with each other. Namely, a straight line A in FIG. 21 should preferably be set as the optical axis for the optical system following the light collecting means. This is because, as described hereinbefore, for efficient illumination of a rectangular fly's eye lens, the Helmholtz-Lagrange invariable should be made smaller.

In the drawing, the parallel light as produced by the parabolic mirror is parallel to the optical axis. However, this is not always necessary. It may be in any direction unless the light from the elliptical mirror 111 defining the opening is intercepted.

Embodiment 12

FIG. 22 is a sectional view of a light collecting mirror according to a twelfth embodiment of the present invention, taken along a section containing the optical axis of the mirror and including a direction, of two orthogonal directions, in which light rays of a largest convergence angle are collected at the light convergence point with a smaller angle. The structure other than the collecting mirror is the same as that shown in FIG. 1. In this embodiment, the light collecting mirror comprises an elliptical mirror 111 as a main reflection mirror, having a first focal point placed at about the center of the light source, and another elliptical mirror 211 as a portion of an auxiliary mirror, as well as a hyperboloids mirror 231 having two focal points placed at substantially the same positions as the two focal points (the light source position and the position 01) of the elliptical mirror 211. The opening of the light collecting mirror has a semi-circular shape as seen from the light convergence point 00 (adjacent to the second focal point of the elliptical mirror 111).

In the sixth embodiment described above, those light rays directed off the elliptical mirror 111 defining the opening are reflected by the spherical mirror 201 backwardly toward the light source. In this embodiment, as compared therewith, they are reflected by the elliptical mirror 211 and the hyperboloids mirror 231 backwardly toward the light source Namely, those light rays directed off the elliptical mirror 111 are reflected by the elliptical mirror 211 toward another focal point 01 of the elliptical mirror 211. The light directed to the focal point 01 of the elliptical mirror 211 is reflected by the hyperboloids mirror 231, and again it is directed backwardly to the central portion of the light source. Since the opening of the light collecting mirror is semi-circular, the light rays reaching the convergence point 00 define a pyramid shape corresponding to a half of a cone having its apex placed at the convergence point 00. Thus, as compared with a conventional mirror, energies from the light source can be used efficiently for illumination of a rectangular fly's eye lens.

In the twelfth embodiment, the optical axis of the optical system following the light collecting means may preferably be set so that, in the two orthogonal directions, largest values of the angles with respect to the optical axis become symmetrical with each other. Namely, a straight line A in FIG. 22 should preferably be set as the optical axis for the optical system following the light collecting means. This is because, as described hereinbefore, for efficient illumination of a rectangular fly's eye lens, the Helmholtz-Lagrange invariable should be made smaller.

Further, the second focal point 01 of the elliptical mirror 211 may be placed at any position, unless the light from the elliptical mirror 111 defining the opening is intercepted. Also, the hyperboloids surface of the mirror 231 closer to the light source may be used.

Embodiment 13

Figure 23:
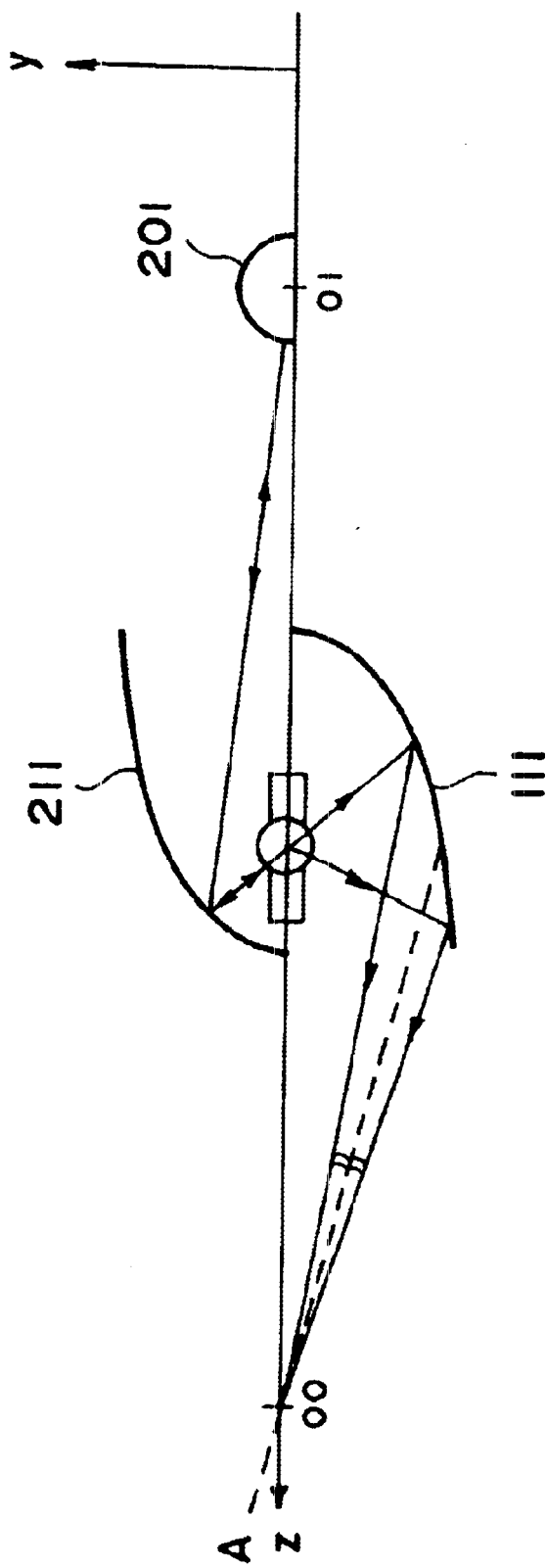
FIG. 23 is a sectional view of a light collecting mirror according to a thirteenth embodiment of the present invention.
Figure 29:
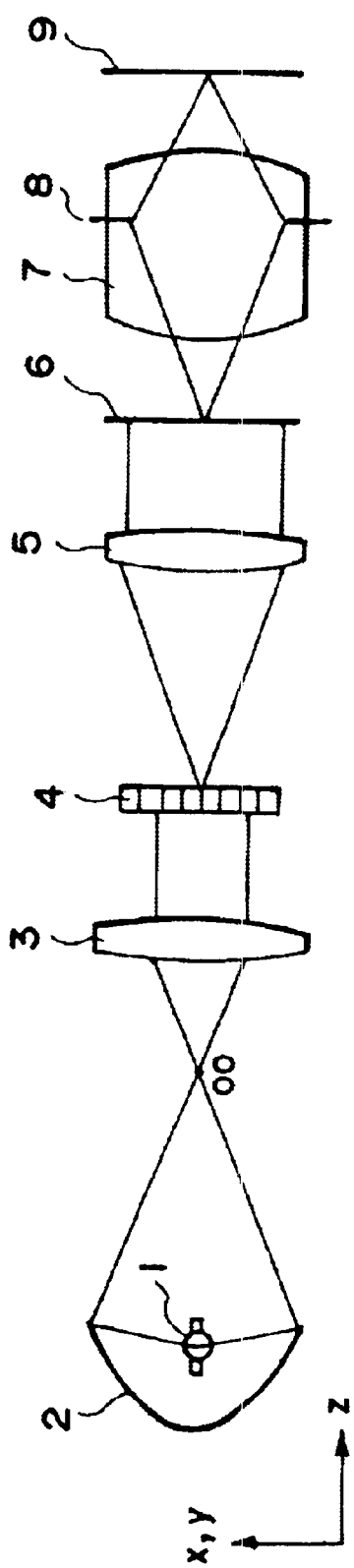
FIG. 29 is a schematic view for explaining a light flux in a conventional illumination system.
Figure 30:
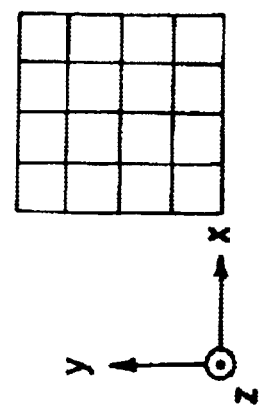
FIG. 30 is a sectional view of a fly's eye lens in relation to an illumination region of square shape.
Figure 31A:
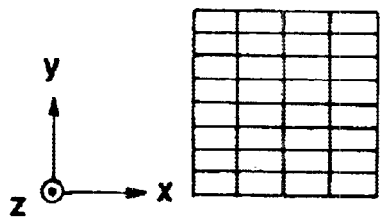
FIGS. 31A, 31B and 31C are a cross section, a vertical section and a horizontal section of a fly's eye lens in relation to an illumination region of rectangular shape.
Figure 31B:
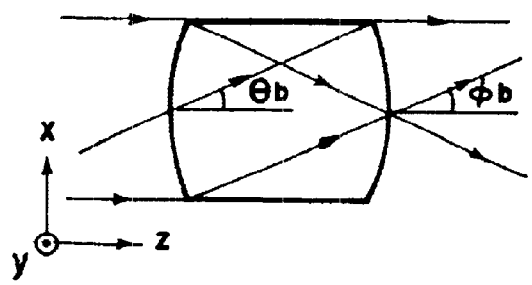
Figure 31C:
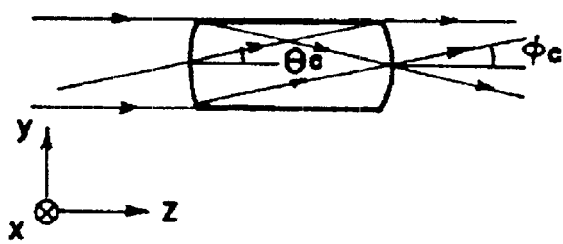
Figure 32:
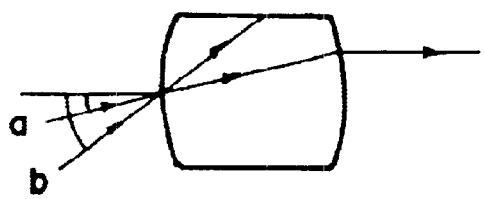
FIG. 32 is a schematic view for explaining light rays in a fly's eye lens.

FIG. 23 is a sectional view of a light collecting mirror according to a thirteenth embodiment of the present invention, taken along a section containing the optical axis of the mirror and including a direction, of two orthogonal directions, in which light rays of a largest convergence angle are collected at the light convergence point with a smaller angle. The structure other than the collecting mirror is the same as that shown in FIG. 1. In this embodiment, the light collecting mirror comprises an elliptical mirror 111 as a main reflection mirror, having a first focal point placed at about the center of the light source, and another elliptical mirror 211 as a portion of an auxiliary mirror, as well as a spherical mirror 201 having its center placed substantially at the same position of the second focal point 01 of the elliptical mirror 211. The opening of the light collecting mirror has a semi-circular shape as seen from the light convergence point 00 (adjacent to the second focal point of the elliptical mirror 111).

In the sixth embodiment described above, those light rays directed off the elliptical mirror 111 defining the opening are reflected by the spherical mirror 201 backwardly toward the light source. In this embodiment, as compared therewith, those light rays directed off the elliptical mirror 111 are reflected by the elliptical mirror 211 and the spherical mirror 201 backwardly toward the light source. Namely, those light rays directed off the elliptical mirror 111 are reflected by the elliptical mirror 211 toward another focal point 01 of the elliptical mirror 211. The light directed to the focal point 01 is reflected by the spherical mirror 201 and, after being reflected by the elliptical mirror 211, it is directed backwardly to the central portion of the light source. Since the opening of the light collecting mirror is semi-circular, the light rays reaching the convergence point 00 define a pyramid shape corresponding to a half of a cone having its apex placed at the convergence point 00. Thus, as compared with a conventional mirror, energies from the light source can be used efficiently for illumination of a rectangular fly's eye lens.

In the thirteen embodiment, the optical axis of the optical system following the light collecting means may preferably be set so that, in the two orthogonal directions, largest values of the angles with respect to the optical axis become symmetrical with each other. Namely, a straight line A in FIG. 23 should preferably be set as the optical axis for the optical system following the light collecting means. This is because, as described hereinbefore, for efficient illumination of a rectangular fly's eye lens, the Helmholtz-Lagrange invariable should be made smaller.

The second focal point 01 of the elliptical mirror 211 may be placed at any position, unless the light from the elliptical mirror 111 defining the opening is intercepted.

Embodiment 14

FIG. 24 is a sectional view of a light collecting mirror according to a fourteenth embodiment of the present invention, taken along a section containing the optical axis of the mirror and including a direction, of two orthogonal directions, in which light rays of a largest convergence angle are collected at the light convergence point with a smaller angle. The structure other than the collecting mirror is the same as that shown in FIG. 1. In this embodiment, the light collecting mirror comprises an elliptical mirror 111 as a main reflection mirror, having a first focal point placed at about the center of the light source, and another elliptical mirror 211 as an auxiliary mirror, having a first focal point placed at about the center of the light source and a second focal point 01 placed at a position different from the convergence point 00 of the elliptical mirror 111. The opening of the light collecting mirror has a semi-circular shape as seen from the light convergence point 00 (adjacent to the second focal point of the elliptical mirror 111).

In the sixth embodiment described above, those light rays directed off the elliptical mirror 111 defining the opening are reflected by the spherical mirror 201 backwardly toward the light source. In this embodiment, as compared therewith, those light rays directed off the elliptical mirror 111 are reflected by the elliptical mirror 211 backwardly toward the light source. Namely, those light rays directed off the elliptical mirror 111 are reflected by the elliptical mirror 211, and they pass through the second focal point 01 of the elliptical mirror 211. Again, these light rays are reflected by the elliptical mirror 111, backwardly to the portion about the center of the light source. Since the opening of the light collecting mirror is semi-circular, the light rays reaching the convergence point 00 define a pyramid shape corresponding to a half of a cone having its apex placed at the convergence point 00. Thus, as compared with a conventional mirror, energies from the light source can be used efficiently for illumination of a rectangular fly's eye lens.

In the fourteenth embodiment, the optical axis of the optical system following the light collecting means may preferably be set so that, in the two orthogonal directions, largest values of the angles with respect to the optical axis become symmetrical with each other. Namely, a straight line A in FIG. 24 should preferably be set as the optical axis for the optical system following the light collecting means. This is because, as described hereinbefore, for efficient illumination of a rectangular fly's eye lens, the Helmholtz-Lagrange invariable should be made smaller.

The second focal point 01 of the elliptical mirror 211 may be placed at any position, unless the light from the elliptical mirror 111 defining the opening is intercepted.

Embodiment 15

FIG. 25 is a section view of a light collecting mirror according to a fifteenth embodiment of the present invention, taken along a section containing the optical axis of the mirror and including a direction, of two orthogonal directions, in which light rays of a largest convergence angle are collected at the light convergence point with a smaller angle. The structure other than the collecting mirror is the same as that shown in FIG. 1. In this embodiment, the light collecting mirror comprises an elliptical mirror 111 as a main reflection mirror, having a first focal point placed at about the center of the light source, and a plane mirror 241 as an auxiliary mirror, disposed intermediate, between two focal points of the elliptical mirror 111.

In the sixth embodiment described above, those light rays directed off the elliptical mirror 111 defining the opening are reflected by the spherical mirror 201 backwardly toward the light source. In this embodiment, as compared therewith, those light rays directed off the elliptical mirror 111 are reflected by the elliptical mirror 111 and the plane mirror 241 backwardly toward the light source. Namely, those light rays directed off the elliptical mirror (lower half in FIG. 25) which defines the opening are reflected by the elliptical mirror (upper half in FIG. 25) which does not define the opening, toward the second focal point 00 of the elliptical mirror 111. The light directed to the focal point 00 is reflected by the plane mirror 241 backwardly to the central portion of the light source. Since the opening of the light collecting mirror is semi-circular, the light rays reaching the convergence point 00 define a pyramid shape corresponding to a half of a cone having its apex placed at the convergence point 00. Thus, as compared with a conventional mirror, energies from the light source can be used efficiently for illumination of a rectangular fly's eye lens.

In the fifteenth embodiment, the optical axis of the optical system following the light collecting means may preferably be set so that, in the two orthogonal directions, largest values of the angles with respect to the optical axis become symmetrical with each other. Namely, a straight line A in FIG. 25 should preferably be set as the optical axis for the optical system following the light collecting means. This is because, as described hereinbefore, for efficient illumination of a rectangular fly's eye lens, the Helmholtz-Lagrange invariable should be made smaller.

In the drawing, one elliptical mirror 111 is used to reflect the light rays emitted upwardly. However, it is not always necessary. A separate elliptical mirror may be used. On that occasion, the plane mirror 241 may be disposed at about the middle between the focal points of such a separate elliptical mirror. Further, there may be an embodiment wherein the main reflection mirror or the auxiliary mirror is divided. FIG. 26 shows an example wherein, in the eighth embodiment, the auxiliary mirror comprising two parabolic mirrors is divided into three mirrors, each parabolic mirror having a focal point placed adjacent to the center of the light source. With this division, a desired angular distribution for the light coming back to the light source can be selected.

Other Embodiments

FIG. 27 shows an embodiment wherein the main reflection mirror having a parabolic surface in the tenth embodiment is divided. Each of the parabolic surfaces have their focal points at about the center of the light source and the convergence point 00. With this division, the elevation angles from the convergence point 00 at positions where the light rays reflected by the hyperboloids surface and the light rays collected by the elliptical mirror impinge against the elliptical mirror, become boundary-discontinuous. Therefore, for disposition of the hyperboloids mirror, a large tolerance can be set for the assembling error in relation to the mirrors.

The same applies to the other embodiments the parabolic mirror, the elliptical mirror, and the hyperboloids mirror may be divided into plural light collecting mirrors having focal points substantially at the same position. Also, the spherical mirror may be divided into plural light collecting mirrors having the same center. The plane mirror may be divided into plural mirrors being parallel to each other.

In place of the two parabolic mirrors 221 and 222 used in FIGS. 19–21, an elliptical mirror 211 and a hyperboloids mirror 231 of FIG. 22, an elliptical mirror 211 and a spherical mirror 201 of FIG. 23, an elliptical mirror 211 of FIG. 24, or an elliptical mirror 111 (not defining an opening) and a plane mirror 241 of FIG. 25 may be used. Substantially the same advantageous results as attainable with the embodiments of FIGS. 19–21 are provided.

Here, the word "boundary" refers to a situation in that, across the boundary, the mirror reflecting light is different. It does not necessarily mean that there is an end of a mirror thereat.

In the embodiments of the present invention described hereinbefore, for simplicity of explanation, a boundary is disposed in a plane containing the optical axis. However, this structure is not always necessary. For example, in FIG. 28, the boundary face in the sixth embodiment is set in a plane not containing the optical axis. Here, the point C in the drawing corresponds to the boundary. Also, the boundary face is not necessarily a plane. The boundary may be set arbitrarily as required.

FIGS. 33A and 33B show an example, that is, an embodiment of an illumination system wherein an internal reflection type optical integrator comprising a square (section) pipe 10 is disposed between a light source 1 and a rectangular fly's eye lens 4. FIG. 33A is a sectional view taken along a Y-Z plane corresponding to the widthwise direction of the rectangular illumination region. FIG. 33B is a sectional view taken along an X-Z plane corresponding to the lengthwise direction thereof. Those elements, corresponding to the elements of the projection exposure apparatus shown in FIG. 1, are denoted by like numerals. In this embodiment, the light collecting means for collecting light emitted from the light source 1 comprises light collecting mirrors of the sixth embodiment shown in FIGS. 15 and 16.

As regards the optical system to which the present invention is applied, illuminating a surface to be illuminated by use of light as collected by light collecting means such as described above is within the scope of the present invention. Further, while in the above-described embodiments a fly's eye lens is used to perform Koehler illumination, use of the light collecting means as described for the light source enables use of various illumination methods such as Koehler illumination based on an internal reflection type optical pipe, for example. There is no limitation in regard to the optical arrangement to be placed after the light collecting means. Thus, any illumination method may be used within the scope of the present invention.

In the drawing, the light emitted by the light source 1 is reflected by a spherical mirror 201 and/or an elliptical mirror 111 and, then, it passes through an i-line filter 12 for intercepting most of the light of wavelengths other than i-line. The light is then collected adjacent to the light entrance surface of the square pipe 10. The light entering the square pipe 10 passes therethrough while repeating multiple reflection at the inside reflection surface of the pipe, and then a plurality of virtual images of the light source 1 are produced on a plane perpendicular to the optical axis. Thus, at the light exit surface of the square pipe 10, a plurality of light beams which apparently come from these virtual images are superposed one upon another and, therefore, a uniform illuminance distribution is produced.

An imaging optical system 11 is arranged to produce an image of the light exit surface of the square pipe 10, at a light entrance surface of a rectangular fly's eye lens 4. The light whose illuminance distribution having been made uniform by the square pipe 10 is then wavefront-divided by the rectangular fly's eye lens 4, and they are superposed again one upon another on the surface of a reticle 6. Thus, as compared with the systems of FIG. 1, the illumination system of this embodiment accomplishes further improvement of uniformness of illuminance on the illumination region.

It is seen from FIGS. 33A and 33B that, regardless of the presence of any other optical element such as a square pipe in front of a rectangular fly's eye lens, the angular distribution of light impinging on the fly's eye lens is determined by the angular distribution at the light convergence point defined by the light collecting mirror. Thus, by making a difference in the angular distribution at the light convergence point of the collecting mirror, between the lengthwise direction and the widthwise direction of the illumination region, as in the present invention, even with the illumination system shown in FIGS. 33A and 33B, effective utilization of light from the light source is well attainable.

With an illumination system of a structure as described hereinbefore, a convergent light whose largest convergence angle with respect to the optical axis of light collecting means is different between two orthogonal directions can be produced. As a result of it, a rectangular fly's eye lens having plural element lenses of rectangular sectional shape can be illuminated efficiently, with a significantly reduced loss of light quantity.

Next, an embodiment of a semiconductor device manufacturing method which uses an exposure apparatus as described above, will be explained.

Figure 34:
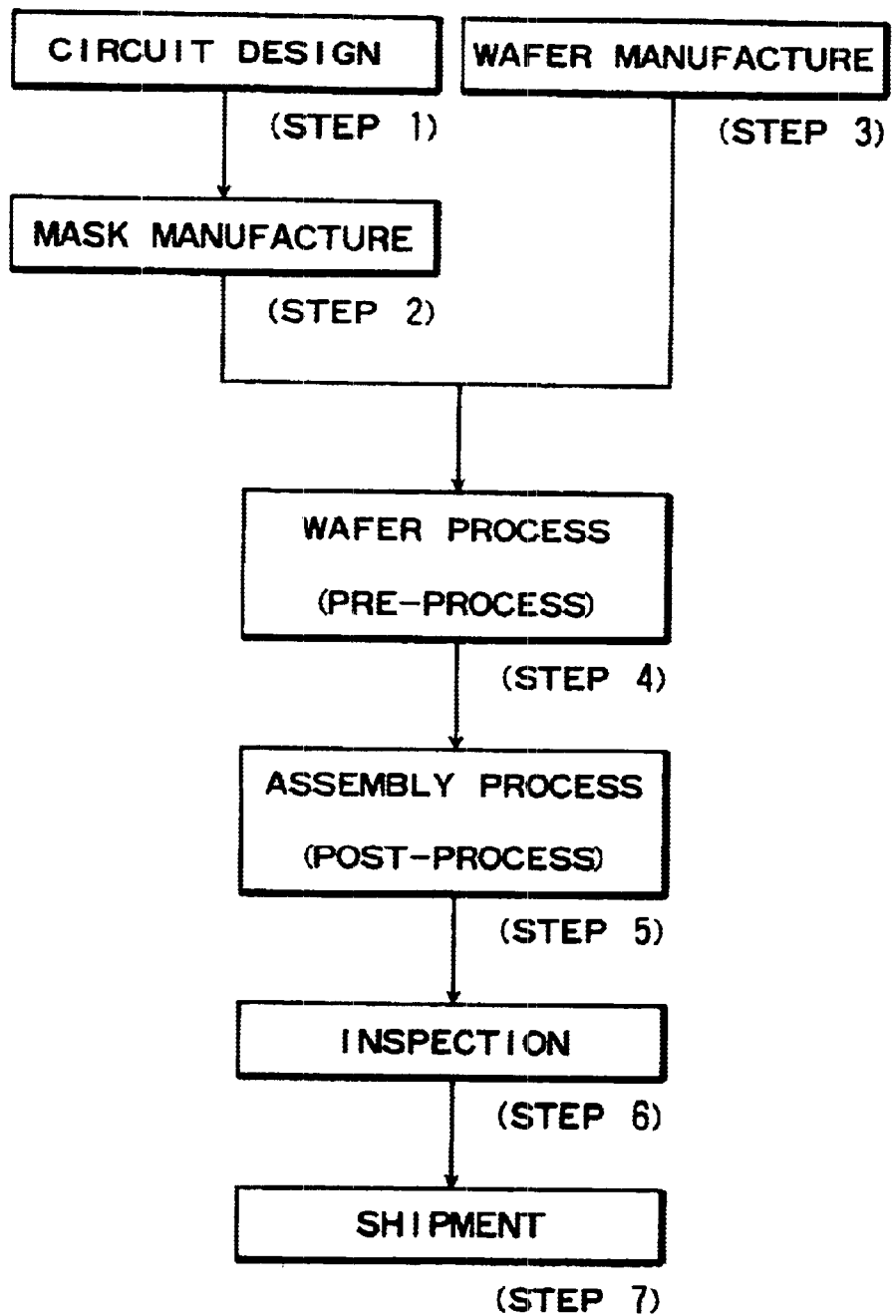
FIG. 34 is a flow chart of semiconductor device manufacturing processes.

FIG. 34 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 35:
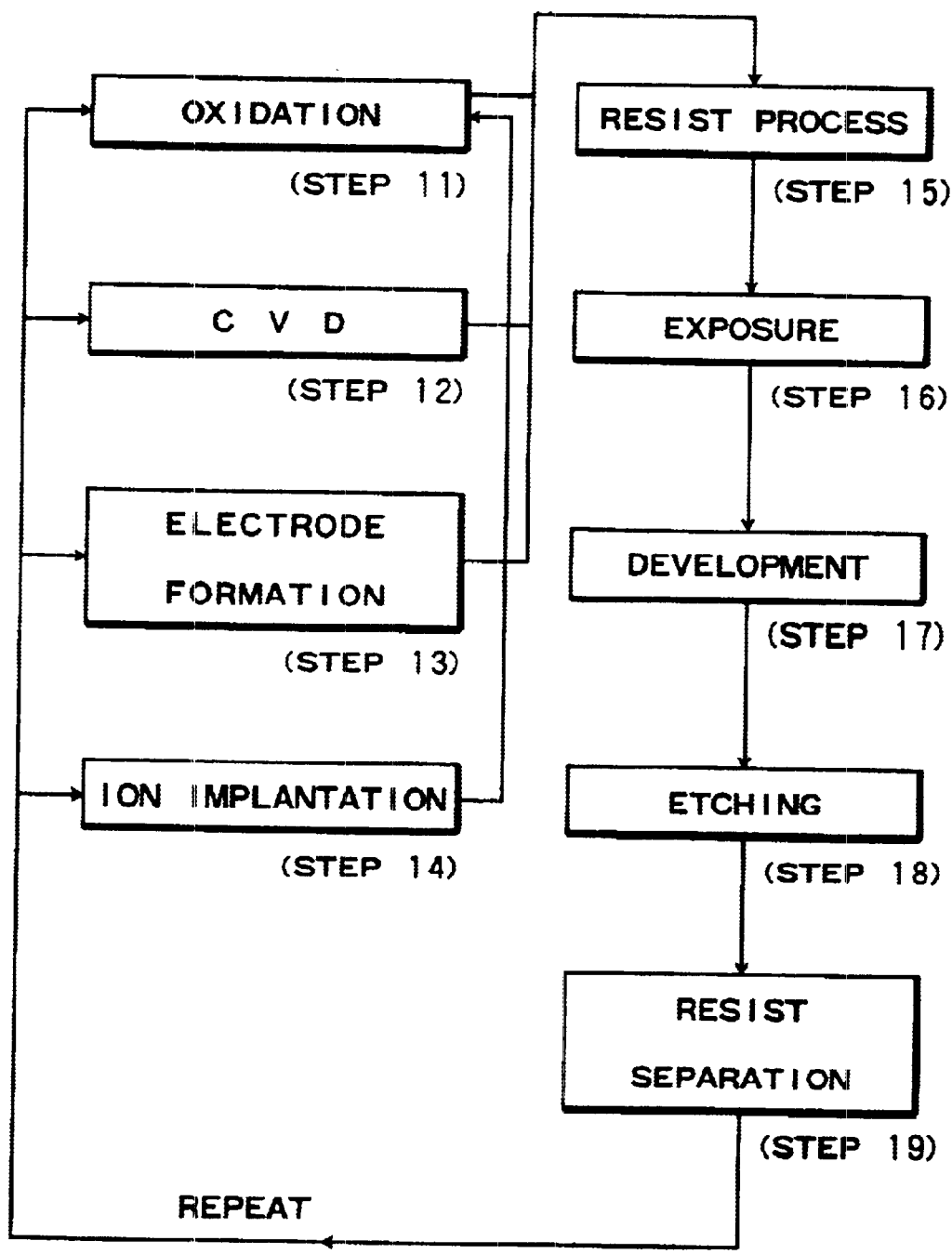
FIG. 35 is a flow chart for explaining details of a wafer process in the procedure of the flow chart of FIG. 34.

FIG. 35 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the water. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:
    an optical system for collecting light from a light source, said optical system including a mirror for reflecting the light, said mirror having an ellipsoidal reflection surface of a shape being out of axial symmetry, for defining an aperture of a rectangular or semicircular shape as seen in an optical axis direction;
    an optical integrator for producing plural light beams by use of light from said optical system, said optical integrator comprising an array of condensing elements each having a light entrance surface of a rectangular shape as seen in the optical axis direction, wherein a lengthwise direction of the rectangular-shaped or semicircular-shaped aperture of the ellipsoidal reflection surface corresponds to a lengthwise direction of the rectangular-shaped light entrance surface of the condensing element; and
    a condenser for illuminating a surface to be illuminated, by use of the plural light beams.

2. An illumination system according to claim 1, wherein said optical system includes an auxiliary mirror for reflecting light, of the light from the light source, which does not impinge on said mirror first, toward said mirror.

3. An illumination system according to claim 2, wherein said auxiliary mirror comprises at least one of a spherical mirror, a hyperboloids mirror, an elliptical mirror, a parabolic mirror and a plane mirror.

4. An illumination system according to claim 1, wherein said optical integrator comprises a fly's eye lens.

5. An illumination system according to claim 1, wherein the light source comprises a lamp.

6. An exposure apparatus, comprising:
    an illumination optical system for illuminating a mask having a pattern formed thereon; and
    a projection optical system for projecting the pattern of the mask onto a wafer,
    wherein said illumination optical system includes an illumination system as recited in claim 1.

7. A device manufacturing method, comprising the steps of:
    coating a wafer with a resist;
    printing a pattern of a mask on the resist-coated wafer through projection exposure using an exposure apparatus as recited in claim 6; and
    developing the wafer on which the mask pattern is transferred.

8. An illumination optical device comprising:
    a collective optical system for collecting light from a light source; and
    an illuminating optical system for projecting light from said collective optical system onto a surface to be illuminated,
    wherein said collective optical system includes (i) an elliptical mirror having a first focal point defined at the light source position, for collecting light from said light source to a second focal point thereof, and (ii) a hyperboloids mirror having two focal points defined at the positions of the first and second focal points of said elliptical mirror, respectively, said hyperboloids mirror being operable to reflect a portion of light from said elliptical mirror, which is collected at an angle not less than a predetermined angle with respect to the second focal point, and to deflect the collected light toward said light source.

9. An illumination optical device comprising:
a collective optical system for collecting light from a light source; and
an illuminating optical system for projecting light from said collective optical system onto a surface to be illuminated,
wherein said collective optical system includes (i) an elliptical mirror having a first focal point defined at the light source position, for collecting light from said light source to a second focal point thereof, and (ii) a plane mirror disposed approximately at a middle between the first and second focal points of said elliptical mirror, said plane mirror being operable to reflect a portion of light from said elliptical mirror, which is collected at an angle not less than a predetermined angle with respect to the second focal point, and to deflect the collected light toward said light source.

10. An illumination optical device comprising:
a collective optical system for collecting light from a light source; and
an illuminating optical system for projecting light from said collective optical system onto a surface to be illuminated,
wherein said collective optical system includes (i) an elliptical mirror having a first focal point defined at the light source position, for collecting light from said light source to a second focal point thereof, (ii) a first hyperboloids mirror having two focal points defined at the positions of the first and second focal points of said elliptical mirror, which is collected at an angle not less than a predetermined angle with respect to the second focal point, and to deflect the collected light toward said light source, and (iii) a second hyperboloids mirror having two focal points defined at the positions of the first and second focal points of said elliptical mirror, respectively, said second hyperboloids mirror being operable to reflect light from said first hyperboloids mirror and to deflect the reflected light toward the second focal point position.

11. An illumination optical device comprising:
a collective optical system for collecting light from a light source; and
an illuminating optical system for projecting light from said collective optical system onto a surface to be illuminated,
wherein said collective optical system includes (i) a segmental elliptical mirror having a first focal point defined at the light source position, for collecting light from said light source to a second focal point thereof, said segmental elliptical mirror shape along a plane parallel to a line that connects the first and second focal points, said segmental elliptical mirror being operable to reflect only a portion of light from said light source, which is in a solid angle range not greater than $2\pi$, and (ii) a mirror group for reflecting light from said light source having a solid angle not less than $2\pi$ and not being reflected by said segmental elliptical mirror, and for deflecting the same toward said light source.

12. An illumination optical device according to claim 11, further comprising a mirror group for reflecting unwanted light, out of light directed from said segmental elliptical mirror, to the second focal point.

13. An illumination optical device according to claim 11, further comprising a hyperboloids mirror having two focal points at the first and second focal point positions of said segmental elliptical mirror, respectively, for reflecting and deflecting unwanted light of the light from said segmental elliptical mirror, toward said light source.

14. An illumination optical device according to claim 11, further comprising a spherical mirror having a curvature center defined at the second focal point position, for reflecting and deflecting unwanted light of the light from said segmental elliptical mirror, toward said light source.

15. An illumination optical device according to claim 11, further comprising another segmental elliptical mirror for reflecting unwanted light of the light from said light source.

16. An illumination optical device comprising:
a collective optical system for collecting light from a light source; and
an illuminating optical system for projecting light from said collective optical system onto a surface to be illuminated,
wherein said collective optical system includes (i) a segmental elliptical mirror having a first focal point defined at the light source position, for collecting light from said light source to a second focal point thereof, said segmental elliptical mirror having a shape defined by cutting an elliptical shape along a plane parallel to a line which connects the first and second focal points, said segmental elliptical mirror being operable to reflect only a portion of light from said light source, which is in a solid angle range not greater than $2\pi$, and (ii) a segmental spherical mirror having a curvature center defined at the first focal point position and having a shape defined by cutting a spherical shape along a plane parallel to a line that connects the first and second focal points, said segmental spherical mirror being operable to reflect light from said light source having a solid angle not less than $2\pi$ and not being reflected by said segmental elliptical mirror, and to deflect the reflected light toward said light source.

17. An illumination optical device according to claim 16, further comprising a mirror group for reflecting unwanted light, out of light directed from said segmental elliptical mirror, to the second focal point.

18. An illumination optical device according to claim 16, further comprising a hyperboloids mirror having two focal points at the first and second focal point positions of said segmental elliptical mirror, respectively, for reflecting and deflecting unwanted light of the light from said segmental elliptical mirror, toward said light source.

19. An illumination optical device according to claim 16, further comprising a spherical mirror having a curvature center defined at the second focal point position, for reflecting and deflecting unwanted light of the light from said segmental elliptical mirror, toward said light source.

20. An illumination optical device according to claim 16, further comprising another segmental elliptical mirror for reflecting unwanted light of the light from said light source.

21. An illumination optical device comprising:
a collective optical system for collecting light from a light source; and
an illuminating optical system for projecting light from said collective optical system onto a surface to be illuminated,
wherein said collective optical system includes (i) a segmental elliptical mirror having a first focal point defined at the light source position, for collecting light from said light source to a second focal point thereof, said segmental elliptical mirror having a shape defined by cutting an elliptical mirror shape along a plane parallel to a line which connects the first and second focal points, said segmental elliptical mirror being operable to reflect only a portion of light from said light source, which is in a solid angle range not greater than $2\pi$, (ii) a segmental paraboloid mirror having a focal point defined at the first focal point position and having a shape defined by cutting a paraboloid shape along a plane parallel to a line which connects the first and second focal points, said segmental paraboloid mirror being operable to reflect light having a solid angle not less than $2\pi$ and not being reflected by said segmental elliptical mirror, and to deflect the reflected light in a predetermined direction, and (iii) a plane mirror having a reflection surface perpendicular to said predetermined direction, said plane mirror being operable to deflect light from said paraboloid mirror to turn back the deflected light to said paraboloid mirror.

22. An illumination optical device according to claim 21, further comprising a mirror group for reflecting unwanted light, out of light directed from said segmental elliptical mirror, to the second focal point.

23. An illumination optical device according to claim 21, further comprising a hyperboloids mirror having two focal points at the first and second focal point positions of said segmental elliptical mirror, respectively, for reflecting and deflecting unwanted light of the light from said segmental elliptical mirror, toward said light source.

24. An illumination optical device according to claim 21, further comprising a spherical mirror having a curvature center defined at the second focal point position, for reflecting and deflecting unwanted light of the light from said segmental elliptical mirror, toward said light source.

25. An illumination optical device according to claim 21, further comprising another segmental elliptical mirror for reflecting unwanted light of the light from said light source.

26. An illumination optical device comprising:
a collective optical system for collecting light from a light source; and
an illuminating optical system for projecting light from said collective optical system onto a surface to be illuminated,
wherein said collective optical system includes (i) a segmental elliptical mirror having a first focal point defined at the light source position, for collecting light from said light source to a second focal point thereof, said segmental elliptical mirror having a shape defined by cutting an elliptical mirror shape along a plane parallel to a line which connects the first and second focal points, said segmental elliptical mirror being operable to reflect only a portion of light from said light source which is in a solid angle range not greater than $2\pi$, (ii) a first segmental paraboloid mirror having a focal point defined at the first focal point position and having a shape defined at the first focal point position and having a shape defined by cutting a paraboloid shape along a plane parallel to a line which connects the first and second focal points, said first segmental paraboloid mirror being operable to reflect light having a solid angle not less than $2\pi$ and not being reflected by said segmental elliptical mirror, and to deflect that reflected light in a direction parallel to the line connecting the first and second focal points, and (iii) a second segmental paraboloid mirror having a focal point defined at the first focal point position and having a shape defined by cutting a paraboloid shape along the plane, said second segmental paraboloid mirror being operable to reflect light having a solid angle not less than $2\pi$ and not being reflected by said segmental elliptical mirror, and to deflect that reflected light in a direction parallel to a line which connects the first and second focal points.

27. An illumination optical device according to claim 26, further comprising a mirror group for reflecting unwanted light, out of light directed from said segmental elliptical mirror, to the second focal point.

28. An illumination optical device according to claim 26, further comprising a hyperboloids mirror having two focal points at the first and second focal point positions of said segmental elliptical mirror, respectively, for reflecting and deflecting unwanted light of the light from said segmental elliptical mirror, toward said light source.

29. An illumination optical device according to claim 26, further comprising a spherical mirror having a curvature center defined at the second focal point position, for reflecting and deflecting unwanted light of the light from said segmental elliptical mirror, toward said light source.

30. An illumination optical device according to claim 26, further comprising another segmental elliptical mirror for reflecting unwanted light of the light from said light source.

31. An illumination optical device according to claim 26, further comprising another segmental elliptical mirror for reflecting unwanted light of the light from said light source.

32. An illumination optical device comprising:
a collective optical system for collecting light from a light source; and
an illuminating optical system for projecting light from said collective optical system onto a surface to be illuminated,
wherein said collective optical system includes (i) a first segmental elliptical mirror having a first focal point defined at the light source position, for collecting light from said light source to a second focal point thereof, said first segmental elliptical mirror having a shape defined by cutting an elliptical mirror shape along a plane parallel to a line which connects the first and second focal points, said first segmental elliptical mirror being operable to reflect only a portion of light from said light source which is in a solid angle range not greater than $2\pi$, (ii) a second segmental paraboloid mirror having a first focal point defined at the first focal point position, for collecting light from said light source to a second focal point thereof, said second segmental elliptical mirror having a shape defined by cutting an elliptical mirror shape along a plane parallel to a line which connects the first and second focal points thereof, said second segmental elliptical mirror being operable to reflect light from said light source which is in a solid angle range not less than $2\pi$, toward the second focal point thereof, and (iii) a hyperboloids mirror having two focal points defined at the first and second focal point positions of the second segmental elliptical mirror, respectively, said hyperboloids mirror being operable to reflect light reflected by said second segmental elliptical mirror and to deflect that reflected light toward said light source.

33. An illumination optical device according to claim 32, further comprising a mirror group for reflecting unwanted light, out of light directed from said segmental elliptical mirror, to the second focal point.

34. An illumination optical device according to claim 32, further comprising a hyperboloids mirror having two focal points at the first and second focal point positions of said segmental elliptical mirror, respectively, for reflecting and deflecting unwanted light of the light from said segmental elliptical mirror, toward said light source.

35. An illumination optical device according to claim 32, further comprising a spherical mirror having a curvature center defined at the second focal point position, for reflecting and deflecting unwanted light of the light from said segmental elliptical mirror, toward said light source.

36. An illumination optical device comprising:

a collective optical system for collecting light from a light source; and an illuminating optical system for projecting light from said collective optical system onto a surface to be illuminated, wherein said collective optical system includes (i) a first segmental elliptical mirror having a first focal point defined at the light source position, for collecting light from said light source to a second focal point thereof, said first segmental elliptical mirror having a shape defined by cutting an elliptical mirror shape along a plane parallel to a line which connects the first and second focal points, said first segmental elliptical mirror being operable to reflect only a portion of light from said light source which is in a solid angle range not greater than 2π, (ii) a second segmental elliptical mirror having a first focal point thereof, said second segmental elliptical mirror having a shape defined by cutting an elliptical mirror shape along a plane parallel to a line which connects the first and second focal points thereof, said second segmental elliptical mirror being operable to reflect light from said light source which is in a solid angle range not less than 2π, toward the second focal point thereof, and (iii) a spherical mirror having a curvature center defined at the second focal point position of the second segmental elliptical mirror, said spherical mirror being operable to reflect light reflected by said second segmental elliptical mirror and to deflect that reflected light toward said second segmental elliptical mirror.

37. An illumination optical device according to claim 36, further comprising a mirror group for reflecting unwanted light, out of light directed from said segmental elliptical mirror, to the second focal point.

38. An illumination optical device according to claim 36, further comprising a hyperboloids mirror having two focal points at the first and second focal point positions of said segmental elliptical mirror, respectively, for reflecting and deflecting unwanted light of the light from said segmental elliptical mirror, toward said light source.

39. An illumination optical device according to claim 36, further comprising a spherical mirror having a curvature center defined at the second focal point position, for reflecting and deflecting unwanted light of the light from said segmental elliptical mirror, toward said light source.

40. An illumination optical device according to claim 36, further comprising another segmental elliptical mirror for reflecting unwanted light of the light from said light source.

41. An illumination optical device comprising:

a collective optical system for collecting light from a light source; and an illuminating optical system for projecting light from said collective optical system onto a surface to be illuminated, wherein said collective optical system includes (i) a first segmental elliptical mirror having a first focal point defined at the light source position, for collecting light from said light source to a second focal point thereof, said first segmental elliptical mirror having a shape defined by cutting an elliptical mirror shape along a plane parallel to a line that connects the first and second focal points, said first segmental elliptical mirror being operable to reflect only a portion of light from said light source which is in a solid angle range not greater than 2π, and (ii) a second segmental elliptical mirror having a first focal point defined at the light source position, for collecting light from said light source to a second focal point thereof, said second segmental elliptical mirror having a shape defined by cutting an elliptical mirror shape along a plane parallel to a line which connects the first and second focal points thereof, said second segmental elliptical mirror being operable to reflect light from said light source which is in a solid angle range not less than 2π, toward the second focal point thereof, and also to reflect and deflect light from the second focal point toward said light source.

42. An illumination optical device according to claim 41, further comprising a mirror group for reflecting unwanted light, out of light directed from said segmental elliptical mirror, to the second focal point.

43. An illumination optical device according to claim 41, further comprising a hyperboloids mirror having two focal points at the first and second focal point positions of said segmental elliptical mirror, respectively, for reflecting and deflecting unwanted light of the light from said segmental elliptical mirror, toward said light source.

44. An illumination optical device according to claim 41, further comprising a spherical mirror having a curvature center defined at the second focal point position, for reflecting and deflecting unwanted light of the light from said segmental elliptical mirror, toward said light source.

45. An illumination optical device according to claim 41, further comprising another segmental elliptical mirror for reflecting unwanted light of the light from said light source.

* * * * *

UNITED STATES PATENT AND TRADEMARK OFFICE
CERTIFICATE OF CORRECTION

PATENT NO.    : 6,639,652 B1
DATED         : October 28, 2003
INVENTOR(S)   : Kenichiro Mori et al.

It is certified that error appears in the above-identified patent and that said Letters Patent is hereby corrected as shown below:

Column 1,
Line 41, "which with and," should read -- which, with and --.

Column 3,
Line 30, "an" should read -- a --.

Column 6,
Line 29, "while the auxiliary reflection" should be deleted.
Line 30, "mirror may an elliptical mirror having a first focal point" should be deleted.
Line 31, "placed about the center of the light source," should be deleted.
Line 57, "is" should read -- it --.
Line 59, "tot he" should read -- to the --.

Column 7,
Line 1, "foal" should read -- focal --.

Column 9,
Line 56, "adjacent" should read -- adjacent to --.

Column 10,
Line 22, "region" should read -- region. --.
Line 33, "arc" should read -- are --.

Column 11,
Line 33, "in X" should read -- in the X --.
Line 34, "and ψ in" should read -- and Ψ in the --.

Line 37, "$(0, 0, +\sqrt{a^2+b^2})$." should read -- $(0, 0, \pm \sqrt{a^2+b^2})$. --

Column 12,
Lines 10 and 47, "(adjacent" should read -- (adjacent to --.
Line 40, "11 as well as a second hyperboloids mirror, having two focal" should be deleted.
Line 41, "points placed at substantially the same position with respect" should be deleted.
Line 42, "to the elliptical mirror" should be deleted.

Column 13,
Line 55, "semicircle" should read -- semi-circle --.
Line 61, "mirror 201" should read -- mirror 201. --.
Line 67, "source" should read -- source. --.

UNITED STATES PATENT AND TRADEMARK OFFICE
CERTIFICATE OF CORRECTION

PATENT NO. : 6,639,652 B1
DATED : October 28, 2003
INVENTOR(S) : Kenichiro Mori et al.

It is certified that error appears in the above-identified patent and that said Letters Patent is hereby corrected as shown below:

<u>Column 14,</u>
Line 44, "defines" should read -- define --.

<u>Column 15,</u>
Line 36, "Portion" should read -- portion --.
Line 43, "lens" should read -- lens. --.

<u>Column 17,</u>
Line 46, "is that" should read -- is the --.

<u>Column 18,</u>
Line 3, "point 000," should read -- point 00, --.

<u>Column 21,</u>
Line 54, "embodiments the parabolic" should read -- embodiments. The parabolic --.

<u>Column 22,</u>
Lines 15-42, the order of (i) the paragraph beginning on line 15 with "FIGS. 33A and 33B" and (ii) the paragraph beginning on line 30 with "As regards the" should be reversed.

<u>Column 23,</u>
Line 51, "water" should read -- wafer --.

Signed and Sealed this

Twenty-seventh Day of April, 2004

JON W. DUDAS
*Acting Director of the United States Patent and Trademark Office*